United States Patent [19]

Arimoto et al.

[11] Patent Number: 5,856,951

[45] Date of Patent: Jan. 5, 1999

[54] SEMICONDUCTOR MEMORY DEVICE WITH AN IMPROVED HIERARCHICAL POWER SUPPLY LINE CONFIGURATION

[75] Inventors: Kazutami Arimoto; Masaki Tsukude, both of Hyogo, Japan

[73] Assignee: Mitsubishi Denki Kabushiki Kaisha, Tokyo, Japan

[21] Appl. No.: 864,756

[22] Filed: May 29, 1997

Related U.S. Application Data

[62] Division of Ser. No. 486,751, Jun. 6, 1995, Pat. No. 5,659,517.

[30] Foreign Application Priority Data

Sep. 9, 1994 [JP] Japan .................................. 6-215658

[51] Int. Cl.$^6$ ...................................................... G11C 7/00
[52] U.S. Cl. ..................... 365/226; 365/189.09; 365/210; 365/228
[58] Field of Search ..................................... 365/226, 228, 365/189.09, 210

[56] References Cited

U.S. PATENT DOCUMENTS

| | | | |
|---|---|---|---|
| 5,200,921 | 4/1993 | Okajima | 365/189.11 |
| 5,258,666 | 11/1993 | Furuki | 307/449 |
| 5,274,601 | 12/1993 | Kawahara et al. | 365/230.06 |
| 5,280,455 | 1/1994 | Kanaishi | 365/229 |
| 5,309,399 | 5/1994 | Murotani | 365/226 |
| 5,341,334 | 8/1994 | Maruyama | 365/230.06 |
| 5,359,243 | 10/1994 | Norman | 307/475 |
| 5,519,657 | 5/1996 | Arimoto | 365/200 |
| 5,583,457 | 12/1996 | Horiguchi et al. | 326/121 |

OTHER PUBLICATIONS

"Switched–Source–Impedance CMOS Circuit for Low Standby Subthreshold Current Gigascale LSI's", Horiguchi et al., 1993 Symposium on VLSI Circuit Digest of Technical Papers, pp. 47–48.

"Stand–by/Active Mode Logic for Sub–1 V 1G/4Gb DRAMS", Takashima et al., 1993 Symposium on VLSI Circuit Digest of Technical Papers, pp. 83–84.

"A Testing Technique for ULSI Memory With On–Chip Voltage Down–Converter", Tsukude et al., Proceedings, International Test Conference 1992, pp. 615–622.

"1V High–Speed Digital Circuit Technology with 0.5μm Multi–Threshold CMOS", Mutoh et al., 1993 IEEE, pp. 186–189.

*Primary Examiner*—Viet Q. Nguyen
*Assistant Examiner*—Hien Nguyen
*Attorney, Agent, or Firm*—McDermott, Will & Emery

[57] ABSTRACT

In a semiconductor integrated circuit device, a voltage setting circuit for setting a voltage level on the sub power source voltage line according to a reference voltage from a reference voltage generating circuit, is provided between a main power source voltage line and a sub power source voltage line. While a current consumption at the standby cycle is reduced, increase of the access delay is prevented. The voltage setting circuit includes a differential amplifier for differentially amplifying a voltage on the sub power source line and the reference voltages and a transistor responsive to an output of the differential amplifier for causing a current flow between the main and sub power source lines, or alternatively a diode-connected insulated gate type transistor receiving the reference voltage at a back gate thereof.

16 Claims, 24 Drawing Sheets

F I G. 3
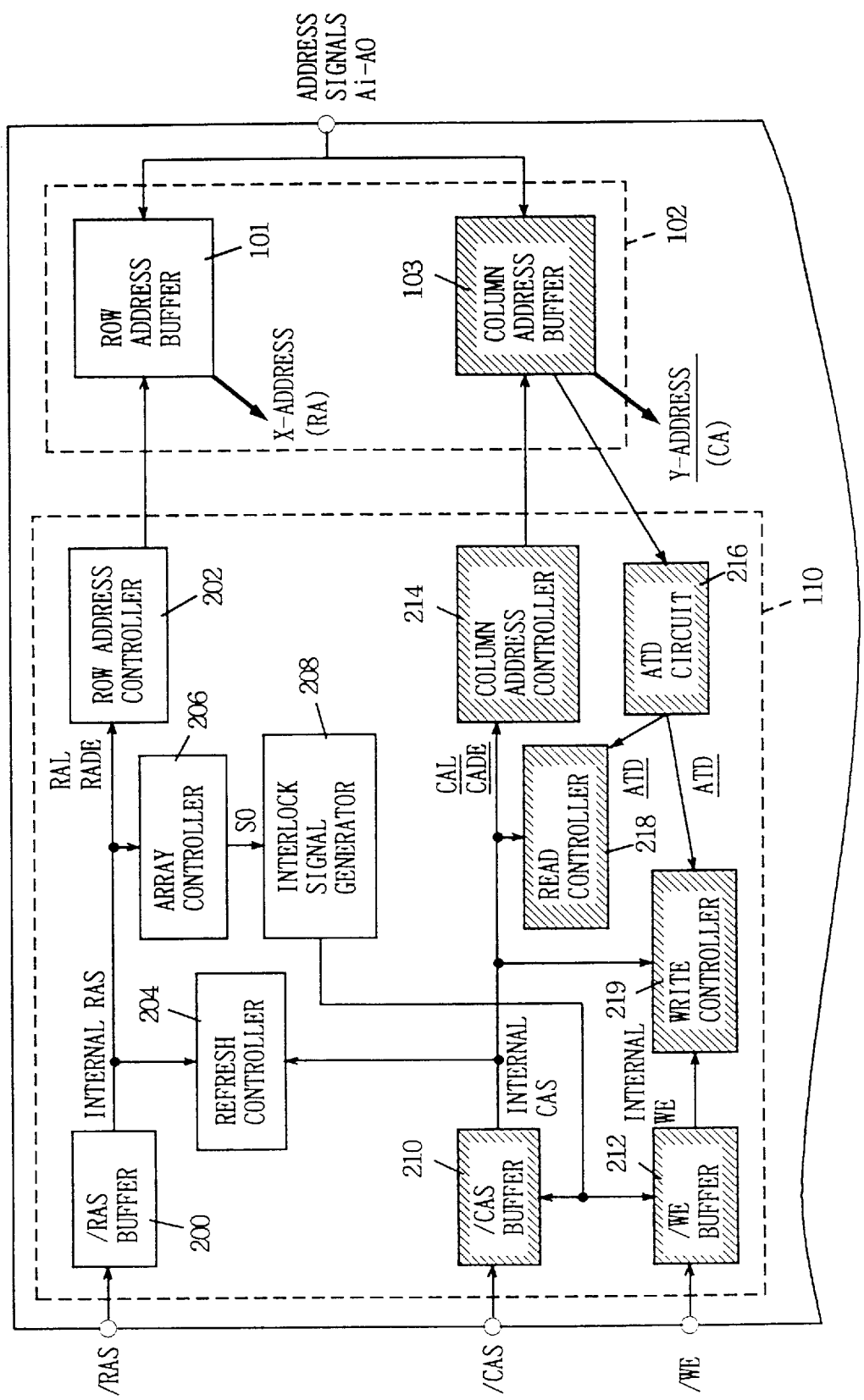

FIG. 14
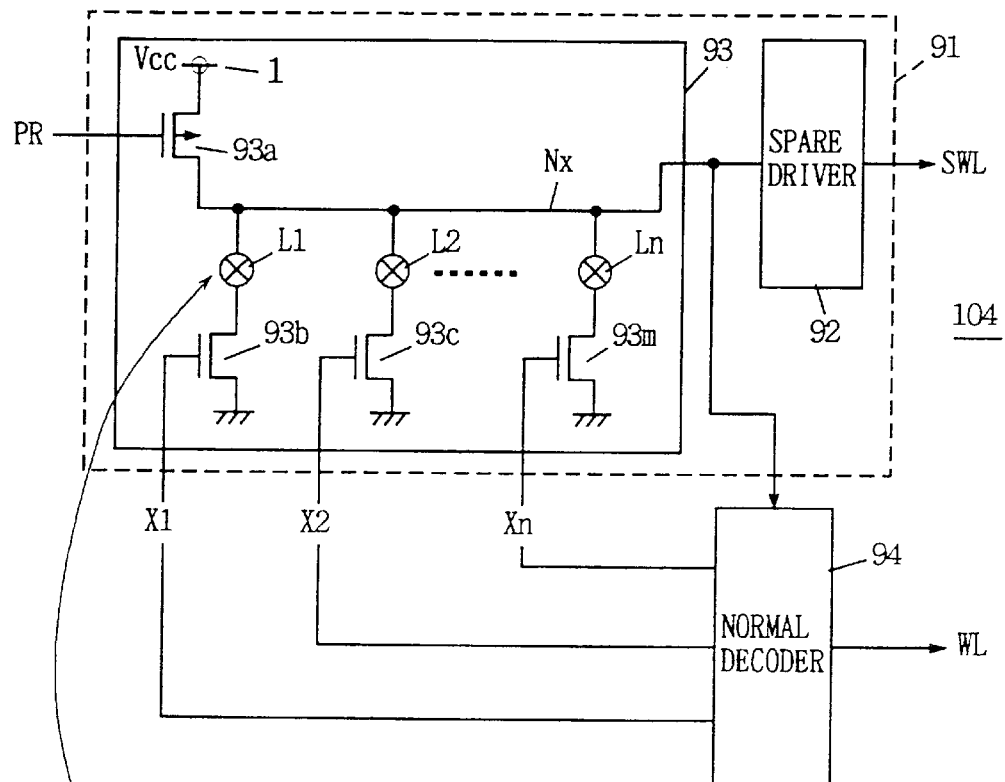
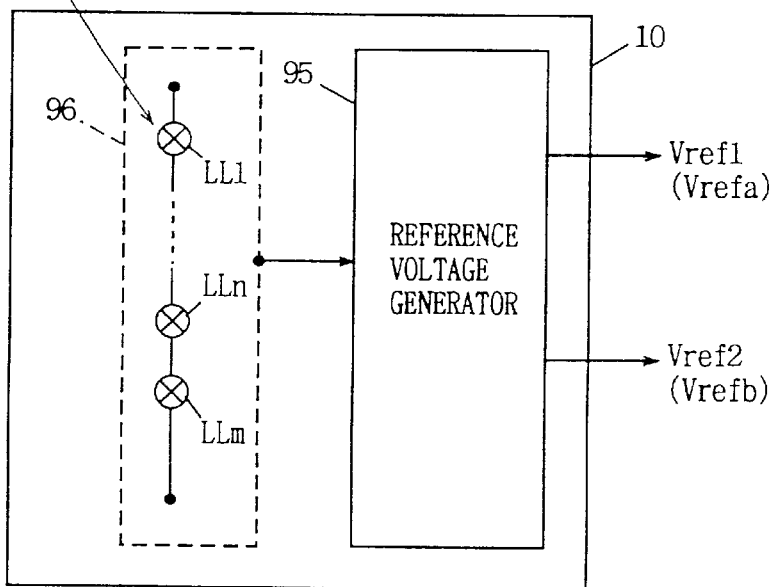

SEMICONDUCTOR MEMORY DEVICE WITH AN IMPROVED HIERARCHICAL POWER SUPPLY LINE CONFIGURATION

This application is a division of application Ser. No. 08/486,751 filed Jun. 6, 1995 and allowed Feb. 12, 1997, now U.S. Pat. No. 5,659,517.

BACKGROUND OF THE INVENTION

1. Field of the Invention

The present invention relates to semiconductor devices, particularly to a configuration for reducing a current consumption of a semiconductor device including a logic gate constituted by CMOS transistors (complementary insulated gate type field effect transistors). More specifically, the invention relates to a configuration for reducing a subthreshold current of a semiconductor memory device such as a DRAM (dynamic random access memory).

2. Description of the Background Art

A CMOS circuit is known well as a semiconductor circuit with a quite small power consumption.

FIG. 24 is a diagram showing configuration of a CMOS inverter. In FIG. 24, the CMOS inverter includes a p-channel MOS transistor (insulated gate type field effect transistor) PT connected between a power source node 900 receiving one operation power source voltage Vcc and an output node and receiving an input signal IN at its gate, and an n-channel MOS transistor NT connected between another power source node 902 receiving another operation power source voltage Vss (usually the ground potential) and the output node 901 and receiving the input signal IN at its gate. A load capacitor C exists at the output node 901. When the input signal IN is at a low level, the p-channel MOS transistor PT is turned on and the n-channel MOS transistor NT is turned off, and the load capacitor C is charged through the p-channel MOS transistor PT and an output signal OUT attains the level of the power source voltage Vcc. When the charging of the load capacitor C is finished, the p-channel MOS transistor PT is turned off since its source and drain attain the same potential. Consequently, no current flows in this state and the power consumption can be neglected.

When the input signal IN is at a high level, the p-channel MOS transistor PT is turned off and the n-channel MOS transistor NT is turned on, and the load capacitor C is discharged through the n-channel MOS transistor NT and the potential at the output node 901 becomes the level of the other power source potential Vss. When the discharging is finished, the n-channel MOS transistor NT is turned off since its source and drain attain the same potential. Consequently, the power consumption power can be neglected in this state too.

A drain current IL flowing through a MOS transistor is expressed by a function of the gate-source voltage of the MOS transistor. If the absolute value of the gate-source voltage becomes larger than that of the threshold voltage of the MOS transistor, a large drain current will flow. Even if the absolute value of the gate-source voltage becomes equal to or less than the absolute value of the threshold voltage, the drain current does not completely become 0. The drain current flowing in this voltage region is called a subthreshold current and is exponentially proportional to the gate-source voltage.

FIG. 25 shows subthreshold current characteristics of an n-channel MOS transistor. In FIG. 25, the abscissa shows a gate-source voltage VGS, and the ordinate shows the logarithmic value of a drain current IL. In FIG. 25, current IL in straight line region of curves I and II is the subthreshold current. The threshold voltage is defined as a gate-source voltage causing a prescribed current flow in the subthreshold current region. For example, a gate-source voltage causing a drain current of 10 mA flowing in a MOS transistor with gate width (channel width) of 10 µm is defined as the threshold voltage. In FIG. 25, the threshold voltages VT0 and VT1 corresponding to the prescribed current I0 are shown.

With miniaturization of a MOS transistor, the power source voltage Vcc is also lowered according to the scaling rule. Therefore, the absolute value of the threshold voltage Vth of the MOS transistor must be lowered also according to the scaling rule in order to improve the performance. For example, in the CMOS inverter shown in FIG. 24, provided that the power source voltage Vcc is 5 V and the threshold voltage Vth of the n-channel MOS transistor NT is 1 V, when the input signal IN changes from 0 V to 1 V or more, a large drain current is caused and discharging of the load capacitor C begins. When the threshold voltage Vth remains the same value and the power source voltage Vcc is lowered to 3 V for example, unless the input signal IN becomes 1 V or more, the n-channel MOS transistor NT cannot be turned on and the load capacitor C cannot be discharged by a large current. That is, when the power source voltage Vcc is 5 V, discharging of the load capacitor is started at the time of ⅕ of the amplitude of the input signal IN, whereas when the power source voltage Vcc is 3 V, discharging of the load capacitor C begins at the time of ⅓ of the amplitude of the input signal IN. Consequently, the input/output response characteristics are deteriorated and the high speed operation cannot be assured. Therefore the absolute value of the threshold voltage Vth must be scaled in a similar manner to the power source voltage.

However, as shown in FIG. 25, if the threshold voltage VT1 is lowered to the threshold voltage VT0, the subthreshold current characteristics are moved from the curve I to the curve II. In this case, since the subthreshold current when the gate voltage becomes 0 V (Vss level) increases from IL1 to IL0 and the current consumption increases, the absolute value of the threshold voltage Vth cannot be scaled down in a similar manner to the power source voltage, and implementation of excellent operation characteristics, particularly high speed operation characteristics, becomes difficult.

A configuration to suppress a subthreshold current without deteriorating the high speed characteristics is disclosed in 1993 Symposium on VLSI Circuit Digest of Technical Papers, pp. 47–48 and pp. 83–84 by Horiuchi et al. and Takashima et al. respectively.

FIG. 26 is a diagram showing the configuration of a power source line disclosed by Horiuchi et al. in the above-mentioned reference. In FIG. 26, n CMOS inverters f1–fn in cascade connection exemplify a CMOS circuit. Each of the inverters f1–fn has the same configuration as that shown in FIG. 24.

In the path where one operation power source voltage is supplied, a first power source line 911 is connected to a first power source node 910 receiving the power source voltage Vcc, and a second power source line 912 is arranged in parallel to the first power source line 911. The first power source line 911 and the second power source line 912 are connected through a high resistor Ra of a high resistance. In parallel to the resistor Ra, a p-channel MOS transistor Q1 is arranged for connecting the first power source line 911 and the second power source line 912 selectively in response to a control signal φc. A capacitor Ca having relatively large capacitance to stabilize the potential of the second power source line 912 is also arranged between the first power source line 911 and the second power source line 912.

The transmission path of another power source voltage Vss (ground potential: 0 V) includes a third power source line 921 connected to a second power source node 920 receiving the other power source voltage (hereinafter referred to simply as "ground voltage") Vss, and a fourth power source line 922 arranged in parallel to the third power source line 921. A high resistance resistor Rb is provided between the third power source line 921 and the fourth power source line 922, and in parallel to the resistor Rb is arranged an n-channel MOS transistor Q2 connecting the third power source line 921 and the fourth power source line 922 selectively in response to a control signal φs. A capacitor Cb having large capacitance to stabilize the potential of the fourth power source line 922 is also arranged between the third power source line 921 and the fourth power source line 922.

Each of the inverters f1, f3 . . . in odd stages has one operation power source node (power source node receiving a high potential) connected to the first power source line 911, and other power source node (power source node receiving a low potential) connected to the fourth power source line 922. Each of the inverters f2, . . . in even stages has one operation power source node connected to the second power source line 912, and other power source node connected to the third power source line 921. Now, operation will be described.

In a DRAM, the state of a signal at the standby state can be predicted previously. Also the state of an output signal can be predicted. In the configuration shown in FIG. 26, the input signal IN becomes low level in the standby state and becomes high level in the active cycle. In the standby cycle, the control signal φc is at high level and the control signal φs is at low level, and both transistors Q1 and Q2 are turned off. In this state, the power source lines 911 and 912 are connected through the resistor Ra, and also the power source lines 921 and 922 are connected through the resistor Rb. The potential VCL of the power source line 912 becomes $$VCL=Vcc-Ia \cdot Ra$$

and the potential VCL of the power source line 922 becomes $$VSL=Vss+Ib \cdot Rb$$

where Ia and Ib designate currents flowing through the resistors Ra and Rb respectively. Now, the input signal IN is at the level of ground potential Vss. In the inverter f1, the p-channel MOS transistor PT is at the ON-state and the output node is charged to the level of power source potential Vcc on the power source line 911. On the other hand, in the n-channel MOS transistor NT, its source potential (potential of the power source node 902) is the intermediate potential VSL and is set to the potential level higher than the ground potential Vss. Consequently in the n-channel MOS transistor NT, its gate-source voltage becomes a negative voltage. As shown in FIG. 25, when the gate-source voltage is −VSL, the subthreshold current becomes the subthreshold current IL2, which is smaller than the subthreshold current IL1 flowing when the potential of the power source node 902 is the ground potential Vss. Here, the operation characteristics of the MOS transistor will be described according to the curve I shown in FIG. 25. As to the ON/OFF state of the n-channel MOS transistor, the state is referred to as the ON-state where the gate-source voltage is higher than the threshold voltage, and the state is referred to as the OFF-state where the gate-source voltage is lower than the threshold voltage. Reversed relationship applies to the case of the p-channel MOS transistor.

In the inverter f2, the input signal /IN (output signal of inverter f1) is at the high level of the power source potential Vcc. In the inverter f2, the p-channel MOS transistor is turned off and the n-channel MOS transistor is turned on. In the p-channel MOS transistor, its source is connected to the power source line 912 and receives the voltage VCL. The gate potential of the p-channel MOS transistor becomes higher than the source potential in the inverter f2, and also the subthreshold current is suppressed in similar manner to the case of the n-channel MOS transistor. The above-mentioned relation applies also to the inverters f3–fn at subsequent stages. Consequently, in the standby state, the subthreshold current in the inverters f1–fn is suppressed and the standby current is reduced.

When the active cycle begins, the control signal φc is made low in level and the control signal φs is made high in level, and both MOS transistors Q1 and Q2 are turned on. The MOS transistors Q1 and Q2 each have a large channel width W and can supply charge/discharge currents sufficiently to the inverters f1–fn. In this state, the potentials of power source lines 912 and 922 attains the levels of power source potential Vcc and the ground potential Vcc respectively. Thereby, in the active cycle, according to the input signal IN, the output signal OUT is brought to the determined state.

FIG. 27 shows operation waveforms and current flowing through the power source line in the circuit shown in FIG. 26. As shown in FIG. 27, at the standby cycle, in response to the signals φs and φc, both MOS transistors Q1 and Q2 are turned off, and the voltage VCL on the power source line 912 and the voltage VSL on the power source line 922 each attain the intermediate potentials between the power source potential Vcc and the ground potential Vss (0 V) respectively. In this state, in the inverters f1–fn, the MOS transistor in the subthreshold region (MOS transistor in the OFF-state) is at more strong OFF-state and the subthreshold current is reduced.

At the active cycle, the control signals φs and φc are made high and low respectively, and the MOS transistors Q1 and Q2 are turned on, and the voltage VCL on the power source line 912 becomes equal to the power source potential Vcc and the voltage VSL on the power source line 922 becomes equal to the ground potential Vss. At the start of the active cycle, the power source current Icc (VCL charging current) flows in order to charge the power source line 912, subsequently when the input signal IN is changed, the inverters f1–fn are operated in response to this change, and charge/discharge currents are produced in order to change the signal levels and a relatively large operation current is produced.

At the transition from the standby cycle to the active cycle, the transistors Q1 and Q2 are turned on and the voltages VCL and VSL are made equal to the power source potential Vcc and the ground potential Vss respectively. The power source lines 912 and 922 are accompanied by interconnection line capacitance or parasitic capacitance by the transistor connected thereto (junction capacitance of a transistor), and some time period is required until the voltages VCL and VSL of the power source lines 912 and 922 are restored to the power source potential Vcc and the ground potential Vss respectively. When the difference between voltage VCL and power source potential Vcc and the difference between the voltage VSL and the ground potential Vss are enlarged in order to decrease the standby current, a long time is required until the voltages VCL and VSL of the power source lines 912 and 922 are restored to the prescribed potentials Vcc and Vss respectively. When circuits (inverters f1–fn) connected to the power source lines 912 and 922 are operated, the voltage level of these main power source lines becomes unstable and the operation speed of these circuits becomes slow (in general, the operation speed of a MOS transistor is given as a function of its gate voltage and the power source voltage.), and the operation characteristics to satisfy the required condition cannot be obtained and the delay of signal propagation becomes large. Therefore, a circuit receiving the operation power source voltages from the power source lines 912 and 922 must start the operation after the voltages VCL and VSL of the power source lines 921 and 922 are restored to the power source potential Vcc and the ground potential Vss. Thus, a problem arises that the operation start timing of a circuit connected to the power source lines 912 and 922 becomes late, and in the case of the DRAM, the access time becomes long.

SUMMARY OF THE INVENTION

An object of the present invention is to provide a semiconductor integrated circuit device which is operated at high speed with low current consumption.

Another object of the present invention is to provide a semiconductor integrated circuit device which can sufficiently suppress a current consumption in the standby cycle without affecting the operation speed.

Still another object of the present invention is to provide a semiconductor integrated circuit device which can sufficiently suppress a current consumption in the standby cycle without increasing the access time.

A semiconductor integrated circuit device according to the first aspect includes a first main power source line for transmitting the first power source voltage, a first sub power source line, a first switching transistor for connecting the first main power source line and the first sub power source line electrically in response to an operation cycle defining signal, first differential amplifier for differentially amplifying a voltage on the first sub power source line and a reference voltage, a second switching transistor for forming a current flowing path between the first main power source line and the first sub power source line in response to an output signal of the first differential amplifier, and a logic gate operating using the voltage on the first sub power source line as one operation power source voltage and performing a prescribed logic processing on an applied input signal for outputting.

A semiconductor integrated circuit device according to other aspect includes a main power source line for transmitting a first power source voltage, a sub power source line, a switching transistor for electrically connecting the main power source line and the sub power source line in response to an operation cycle defining signal, an insulated gate type field effect transistor having one conduction node connected to the main power source line and other conduction node connected to the sub power source line and a control electrode connected to either the main power source line or the sub power source line so as to form a diode from the high potential side to the low potential side, a logic gate operating using the voltage on the sub power source line as one operation power source voltage and performing a prescribed logic processing on a given input signal and outputting the processed signal, and a reference voltage generating circuit applying the reference voltage to a back gate of the insulated gate type field effect transistor.

The reference voltage generating circuit preferably includes means for adjusting the level of the reference voltage.

The reference voltage generating circuit preferably includes means for changing the voltage level of the reference voltage in response to a specific operation mode designation signal to designate the specific operation mode.

Preferably the semiconductor integrated circuit device further includes a memory cell array having a plurality of memory cells arranged in a matrix of rows and columns, a program circuit including fusible link elements storing a defective address to specify an address in row or column of a defective memory cell in the memory cell array, and a level adjusting circuit including program elements made of the same material as that of the fusible link elements of the program circuit and adjusting the voltage level of the reference voltage.

Preferably the semiconductor integrated circuit device further includes a memory cell array including a plurality of memory cells arranged in a matrix of rows and columns, and an input buffer operating using the voltage on the power source line as one operation power source voltage and performing a buffer processing on external signals including an operation cycle defining signal, a data input/output mode designating signal and an address signal and generating internal signals. The logic gate preferably includes a row decoding circuit for decoding row address signals included in the internal signals from the input buffer and generating a row designating signal to select a row in the memory cell array.

Also preferably the semiconductor integrated circuit device further includes a second sub power source line, a third switching transistor for electrically connecting the main power source line and the second sub power source line in response to the operation cycle defining signal, a second differential amplifier for differentially amplifying the second reference voltage from the reference voltage generating means different in voltage level from the first reference voltage and the voltage on the second sub power source line, and a fourth switching transistor for forming a current flowing path between the main power source line and the second power source line in response to an output signal of the second differential amplifier.

Also preferably the semiconductor integrated circuit device further includes a second sub power source line, a second switching transistor for electrically connecting the second sub power source line and the main power source line in response to the operation cycle defining signal, a second insulated gate type field effect transistor having a back gate receiving the second reference voltage from a reference voltage generating means different in voltage level from the preceding reference voltage and one conduction node connected to the main power source line and other conduction node connected to the second sub power source line and a control electrode node connected to either the main power source line or the sub power source line so as to form a diode from the high potential side to the low potential side, and a second logic gate operating using the voltage on the second sub power source line as one operation power source voltage and performing a prescribed logic processing on an applied given input signal and outputting the processed signal.

In a semiconductor integrated circuit device according to the first aspect, the second switching transistor maintains the voltage level of the power source line to the reference voltage level and thereby maintains the sub power source line to a required voltage level stably.

In a semiconductor integrated circuit device according to other aspect, the reference voltage is applied to the back gate of the insulated gate type field effect transistor, and the threshold voltage of the insulated gate type field effect transistor can be substantially maintained to a constant value irrespective of variation of manufacturing parameters, and the sub power source line can be maintained to a required voltage level stably by the diode-connected insulated gate type field effect transistor.

Also the reference voltage is adjusted by the reference voltage adjusting means, so that the restoring time of the voltage of the sub power source line to the power source voltage on the main power source line and the current consumption at the standby cycle can be optimized.

The reference voltage is changed by a specific mode designating signal, whereby for example, in a special mode such as a data holding mode, the standby current can be further reduced and thus the current consumption and the voltage on the sub power source line according to an operation mode can be realized.

A program element to adjust the reference voltage level is made of the same material as that of a programming link element included in a redundant circuit to repair a defective memory cell in the memory cell array, and thereby programming of the program element for setting the reference voltage level can be carried out in the same process as that of the defective address programming of the redundant circuit and the program time for setting the reference voltage can be eliminated apparently.

An input buffer for receiving external signals is operated by the voltage of the main power source line, so that the restoring time of the operation power source voltage to the prescribed voltage level is eliminated and the input buffer can be operated at an early timing, and a circuit with a late operation start timing, such as a row selecting circuit, is operated using the voltage from the sub power source line as one power source voltage, so that the restoring time of the voltage level of the sub power source line to the voltage level on the main power source line can be eliminated apparently and thus increase of the access time can be prevented without increasing the standby current.

The level of the reference voltage to determine the voltage level of the sub power source line has different values, so that for a circuit receiving an input signal brought to a determined state at an earlier timing, difference to the voltage of the main power source line is decreased and the restoring time to the voltage on the main power source line is reduced. Thereby the high speed operation becomes possible without increasing the standby current and without delaying the operation start timing of each logic gate.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 3 is a diagram showing more in detail a configuration of a peripheral circuit of the semiconductor integrated circuit device shown in FIG. 1;

FIG. 14 is a diagram showing a c onfiguration of a main part of a semi conductor integrated circuit device according to a fourth embodiment of the invention;

DESCRIPTION OF PREFERRED EMBODIMENTS

The present invention can be applied to a semiconductor integrated circuit having a standby cycle and an active cycle as operation cycles where a logic level of an input/output signal of a logic gate in the standby cycle can be predetermined. In the following description, however, as an example of semiconductor integrated circuits, a dynamic semiconductor memory device such as a dynamic random access memory will be described.

Figure 1:
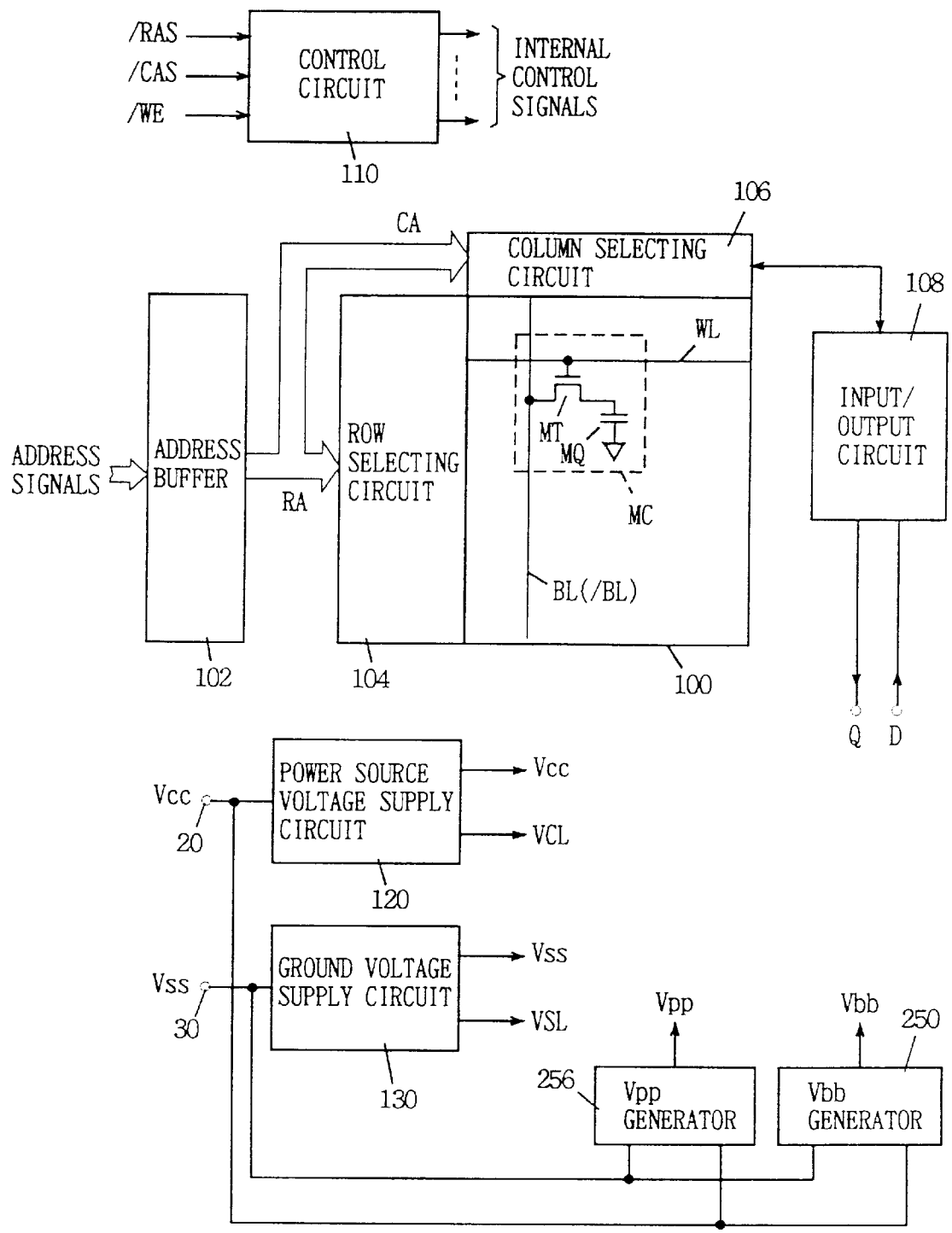
FIG. 1 is a diagram showing schematically a whole configuration of a semiconductor integrated circuit device according to a first embodiment of the invention.

FIG. 1 is a diagram showing schematically a whole configuration of a semiconductor memory device (DRAM) according to an embodiment of the present invention. In FIG. 1, the DRAM includes a memory cell array 100 where memory cells MC are arranged in matrix of rows and columns, a row selecting circuit 104 for decoding internal row address signals (X address) RA from an address buffer 102 and selecting a corresponding row (word line) in the memory cell array 100, a column selecting circuit 106 for decoding internal column address signals (Y address) CA from the address buffer 102 and selecting a column (bit lines BL and /BL) in the memory cell array 100, and an input/output circuit 108 for writing or reading data to the memory cell arranged corresponding to the crossing of the row and the column selected by the row selecting circuit 104 and the column selecting circuit 106.

In FIG. 1, the memory cell MC arranged corresponding to the crossing of one word line WL and one bit line BL (or /BL) is shown representatively. In the memory cell array 100, in the case of "folded bit line configuration", a column line is constituted by a bit line pair BL and /BL transmitting signals complementary to each other, and memory cells arranged in one column are connected to one bit line BL (or /BL) of the corresponding bit line pair. Memory cells MC arranged in one row are connected to the word line WL. The memory cell MC includes a memory capacitor MQ for storing information, and a memory transistor MT for connecting the memory capacitor MQ to the corresponding bit line BL (or /BL) in response to the signal potential on the corresponding word line WL.

The DRAM further includes a control circuit 110 for generating various internal control signals according to externally applied control signals such as a row address strobe signal /RAS, a column address strobe signal /CAS and a write enable signal /WE, a power source voltage supply circuit 120 for generating a high level power source voltage VCL from one power source voltage Vcc supplied to one power source node 20 for supplying to each circuit, and a ground voltage supply circuit 130 for generating a low level power source voltage VSL from another power source voltage (ground voltage) Vss supplied to other power source node (ground node) 30 for supplying to each circuit.

In FIG. 1, the power source voltage supply circuit 120 is shown transmitting both the power source potential Vcc and the high level power source voltage VCL to each internal circuit. This intends to show that both the power source voltage Vcc and the high level power source voltage VCL are transmitted to each circuit by the main power source line and the sub power source line, as hereinafter described. Also the ground voltage supply circuit 130 is shown transmitting the ground potential Vss and the low level power source voltage Vss to inner circuits.

Also in FIG. 1, a Vpp generating circuit 256 and a Vbb generating circuit 250 for generating high voltage Vpp and negative voltage Vbb from the power source potential Vcc supplied to the power source terminal 20 and the ground potential Vss supplied to the ground terminal 30 are shown. The high voltage Vpp from the Vpp generating circuit 256 is transmitted through the row selecting circuit 104 to a selected word line WL in the memory cell array 100. Thereby loss of write voltage to the memory capacitor MQ due to threshold voltage loss of the transistor MT included in the memory cell MC is prevented. The negative voltage Vbb from the Vbb generating circuit 250 is applied at least to a substrate region of the memory array 100. By applying the negative voltage Vbb to the substrate region of the memory array 100, stabilization of the threshold voltage of an n-channel MOS transistor, prevention of turn-off of a parasitic MOS transistor in the signal line region and the like are realized as hereinafter described.

Although the configuration will be described in detail afterwards, the control circuit 110 includes a circuit for generating control signals related to row selection operation and a circuit for generating control signals related to column selection operation. The row address strobe signal /RAS determines the operation cycle of the DRAM, that is, the standby cycle at an external access waiting state and the active cycle where an external access is made. Also the row address strobe signal /RAS starts the operation related to the row selection within the DRAM. A circuit having an active/non-active state determined according to the row address strobe signal /RAS is hereinafter referred to as "row system circuit".

The column address strobe signal /CAS starts the operation related to the column selection of the DRAM (including data input/output operation) at the active state (L level) of the signal /RAS. The write enable signal /WE designates whether data writing should be done or not, and designates the data writing at the low level state and designates the data reading at the high level state. The data reading timing is determined by activation of the column address strobe signal /CAS, and the data writing timing is determined by activation of the signal /WE or the signal /CAS, whichever is later. A circuit having an active/non-active state determined according to the signal /CAS is hereinafter referred to as "column system circuit". Such configuration may be utilized that an output enable signal /OE is further supplied.

Although each configuration will be described in detail afterwards, the power source voltage supply circuit 120 and the ground voltage supply circuit 130 are provided for row system circuitry and column system circuitry separately, and impedances (resistance) of the power source lines transmitting the voltages VCL and VSL are changed according to the operation state (operation cycle and operation period) of the DRAM, thereby suppressing the subthreshold current.

Figure 2:
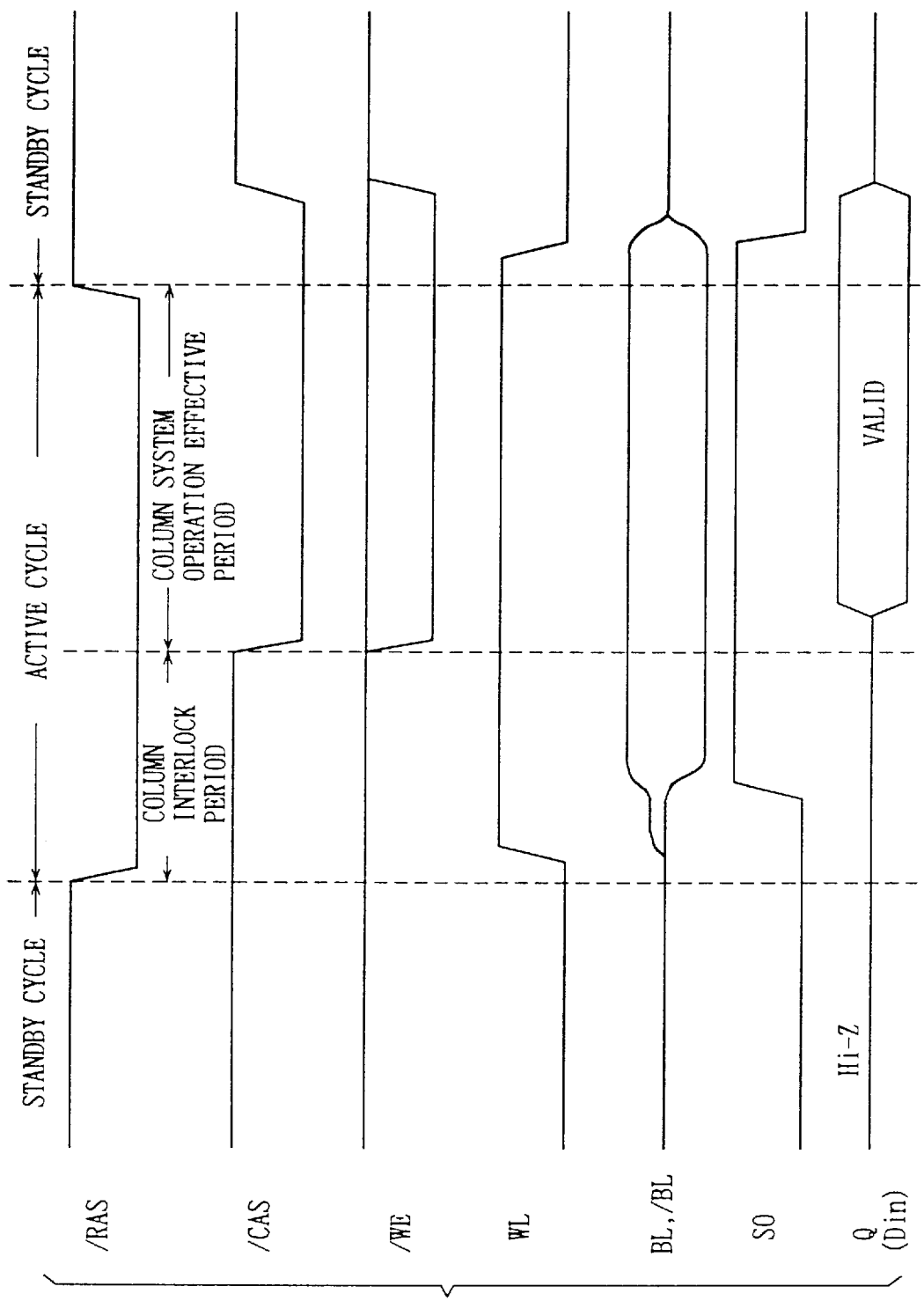
FIG. 2 is a signal waveform chart showing operation of the semiconductor integrated circuit device shown in FIG. 1.

Now, the data input/output operation of the DRAM shown in FIG. 1 will be briefly described referring also to an operation waveform chart shown in FIG. 2. When the external row address strobe signal /RAS is at the non-active state of the high level, the DRAM is at the standby cycle. In this state, in the memory cell array 100, word line WL is at the non-selected state at low level, and also the bit lines BL and /BL are precharged to an intermediate potential (Vcc/2) level. Also the sense amplifier activation signal SO is at the non-active state of low level.

Although not shown in FIG. 1, sense amplifiers are provided for each bit line pair BL, /BL, and at the activation state, the sense amplifiers differentially amplify the potential of each bit line of a corresponding bit line pair. The input/output data Din (and Q) are at the invalid state. In FIG. 2, this state is shown as high impedance (electrically floating state) Hi-Z.

If the signal /RAS falls to low level, the active cycle starts and an external access to the DRAM is made. At first, the bit lines BL and /BL held to the intermediate potential are brought to the floating state at the precharge potential. The address buffer 102 accepts an applied address signal under control of the control circuit 110, and generates an internal row address signal RA. The row selecting circuit 104 decodes the internal row address signal RA, and the potential of the word line provided corresponding to the addressed row is raised to high level. Data held by a memory cell connected to the selected word line WL (potential of one electrode (storage node) of the memory capacitor MQ) is transmitted to the corresponding bit line BL or /BL through the memory transistor MT. Thereby the potential of the bit line BL or /BL is changed according to transmitted data held by the selected memory cell. The other bit line /BL or BL in the pair holds the precharge potential (Vcc/2).

Subsequently the sense amplifier activation signal SO is activated, and a sense amplifier (not shown) is operated and the potential of the bit line pair BL and /BL is amplified differentially, and data held by the memory cell are detected and amplified. FIG. 2 shows the case where the selected memory cell holds the data of high level. If the potential of the bit lines BL and /BL is determined to the high level (power source voltage Vcc level) and the low level (ground voltage Vss level), the column interlock period is finished and operation of the column system circuit is allowed.

In the period where an output signal of a column system circuit is made effective, the external column address strobe signal /CAS is made effective and becomes active state at low level. In response to the column strobe signal /CAS of low level, the address buffer 102 accepts the currently applied address signal and generates an internal column address signal CA. The column selecting circuit 106 decodes the internal column address signal CA and selects a corresponding column (bit line pair) in the memory cell array 100. In the data reading mode, the input/output circuit 108 outputs the valid data Q in response to fall of the column address strobe signal /CAS. In the data writing mode, if both the write enable signal /WE and the column address strobe signal /CAS are brought to low level, valid inner write data are produced from the external write data D and written in the selected memory cell (memory cell arranged in the crossing of the selected row and column).

If the write/read of the necessary memory cell data is finished, the row address strobe signal /RAS rises to high level of the non-active state and the active cycle is finished. Thereby the effective period of the column system operation is finished and the word line WL in the selective state brought to non-selective state, and also the sense amplifier activation signal SO is made non-active and then the bit lines BL and /BL are equalized and precharged to the intermediate potential. And then, if the column address strobe signal /CAS becomes non-active state and also the write enable signal /WE becomes high level, one memory cycle is finished.

FIG. 3 is a block diagram showing a detailed configuration of the address buffer and the control circuit shown in FIG. 1. In FIG. 3, the address buffer 102 includes a row address buffer 101 for generating X address (internal row address signal RA) from externally applied address signals Ai–A0, and a column address buffer 103 for generating Y address (internal column address signal CA) from the address signals Ai–A0. The row address signal and the column address signal are time divisionally multiplexed. The timing for the row address buffer 101 and the column address buffer 103 to generate the X address and the Y address respectively is determined by the internal control signals from the control circuit 110.

The control circuit 110 includes a /RAS buffer 200 for generating an internal RAS signal, a row address latch signal RAL and a row address enable signal RADE in response to the external row address strobe signals /RAS, a row address controller 202 for activating the row address buffer 101 in response to the signals RAL and RADE from the /RAS buffer 200, an array controller 206 for generating a word line drive signal RX (described later) and the sense amplifier activation signal SO in response to the internal RAS signal from the /RAS buffer 200, and an interlock signal generating circuit 208 for generating an interlock signal in response to the signal (sense amplifier activation signal) from the array controller 206. The interlock signal from the interlock signal generating circuit 208 determines the interlock period and the effective period of column system circuitry operation as shown in FIG. 2, and enables the operation related to the column selection.

The control circuit 110 further includes a /CAS buffer 210 for generating an internal CAS signal, a column address latch signal CAL and a column address enable signal CADE in response to the external column address strobe signal /CAS, a WE buffer 212 for generating an internal WE signal in response to the write enable signal /WE from the outside, a column address controller 214 for controlling the operation of the column address buffer 103 in response to the signals CAL and CADE from the /CAS buffer 210, an ATD circuit 216 for detecting the changing time point of the Y address from the column address buffer 103, a read controller 218 for generating signals to activate the data read system circuitry of the input/output circuit shown in FIG. 1 in response to the internal CAS signal from the /CAS buffer 210 and the address transition detection signal ATD from the ATD circuit 216, and a write controller 219 for generating signals to activate the data write system circuitry of the input/output circuit shown in FIG. 1 in response to the internal CAS signal from the /CAS buffer 210, the internal WE signal from the WE buffer 212 and the address transition detection signal ATD from the ATD circuit 216.

In the DRAM, the specification provides the address access time required after a column address signal is applied until the valid data are outputted. Thus, the ATD circuit 216 is installed in order to detect the change of a column address signal. According to the address transition detection signal ATD from the ATD circuit 216, the operation timing of the column system circuits such as the column decoder and a preamplifier (described later) is determined. The read controller 218 generates a preamplifier enable signal PAE according to the address transition detection signal ATD from the ATD circuit 216, and outputs an output enable signal OEM (described later) according to the signal /CAS. The write controller 219 generates the signal WDE to activate a write driver as described later according to the internal WE signal from the /WE buffer 212 and the address transition detection signal ATD, and outputs a data latch signal DIL to an input buffer as described later according to the internal CAS signal from the /CAS buffer 210 and the address transition detection signal ATD from the ATD circuit 216.

The row address controller 202 causes the row address buffer 101 to latch a row address in response to the row address latch signal RAL, and renders the internal row address signal (X address) effective in response to the row address enable signal RADE. The column controller 214 makes the column address buffer 103 execute the address latch operation when the column address latch signal CAL becomes active, and subsequently the column address controller 214 makes the internal column address signal CA (Y address) effective when the column address enable signal CADE becomes active.

The interlock signal from the interlock signal generating circuit 208 is supplied to the /CAS buffer 210 and the /WE buffer 212. When the output of the interlock signal generating circuit 208 is at the non-active state and the column interlock period is designated, the internal signal generating operation of the /CAS buffer 210 and the /WE buffer 212 is brought into the waiting state. Also in the ATD circuit 216, according to the column interlock period designating signal (interlock signal at non-active state) from the interlock signal generating circuit 218, generation of the address transition detection signal ATD is brought into the waiting state.

When the refresh operation is designated (CBR mode) according to the internal RAS signal from the /RAS buffer 200 and the internal CAS signal from the /CAS buffer 210, the refresh controller 204 internally generates an internal RAS signal having a prescribed time width and executes the operation necessary for the refresh. The refresh controller 202 decides that the refresh mode is designated, when the column address strobe signal /CAS falls before the rise of the row address strobe signal /RAS. When the refresh mode is designated, the column selection operation is forbidden usually (forbidding of generation of internal CAS signal and internal WE signal).

In the configuration shown in FIG. 3, circuits operating in relation to the signal /RAS, that is, the row system circuits are /RAS buffer 200, row address controller 202, refresh controller 204, array controller 206, interlock signal generating circuit 208 and row address buffer 101. The column system circuits in relation to the column selection are /CAS buffer 210, /WE buffer 212, column address controller 214, ATD circuit 216, read controller 218, write controller 219 and column address buffer 103.

Figure 4:
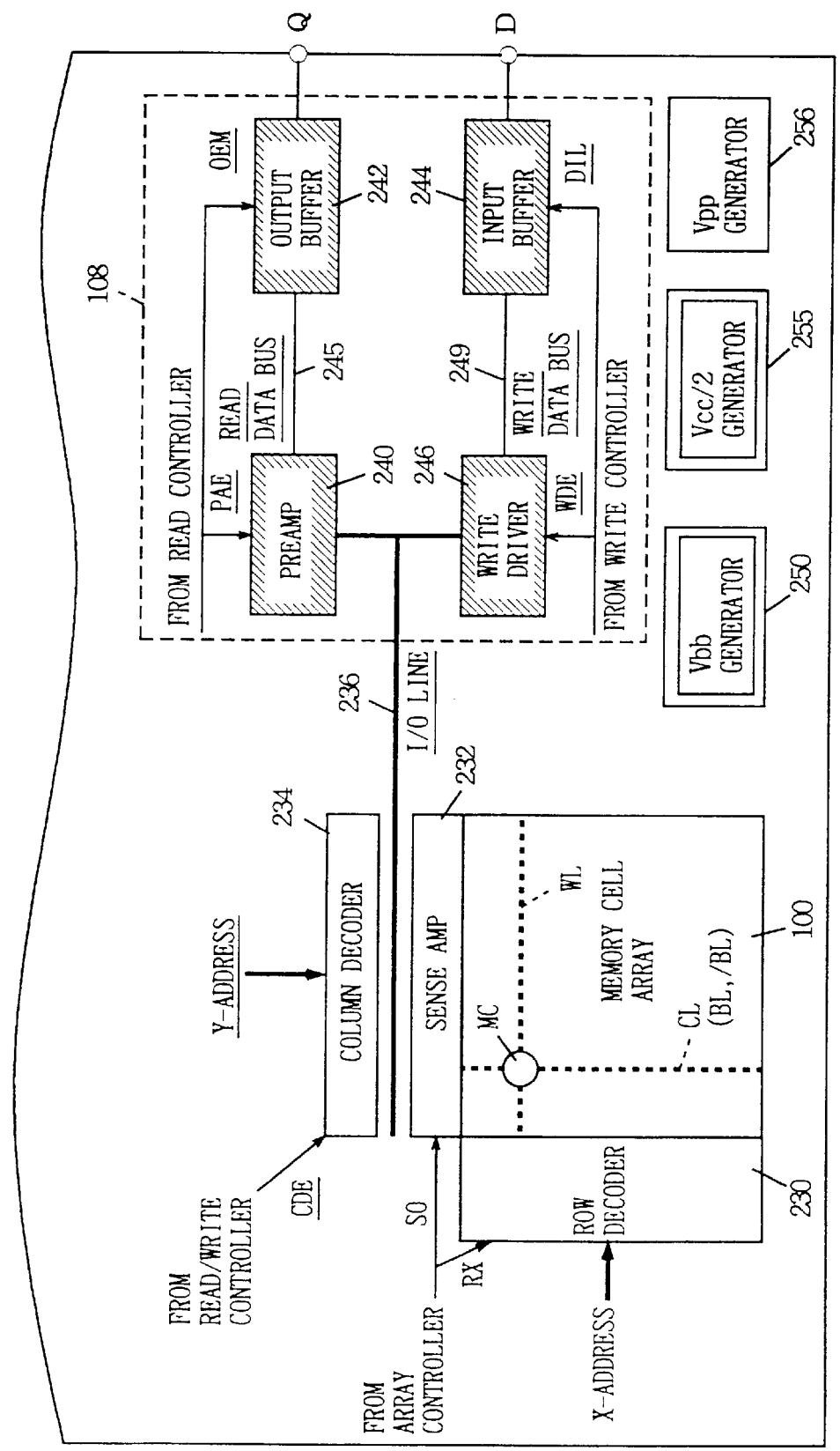
FIG. 4 is a diagram showing more in detail a configuration of a peripheral circuit of the semiconductor integrated circuit device shown in FIG. 1.

FIG. 4 is a block diagram showing a detailed configuration of the memory cell array section and the input/output circuit shown in FIG. 1. In FIG. 4, the row selecting circuit 104 includes a row decoder 230 for decoding the X address (internal row address signal RA) supplied from the row address buffer 101 shown in FIG. 3, selecting a corresponding word line in the memory cell array 104, and transmitting a word line drive signal RX supplied from the array controller 206 onto the selected word line WL. The memory cell array 104 is provided with a sense amplifier circuit 232 activated by the sense amplifier activation signal SO supplied from the array controller 206 (refer to FIG. 3) for differentially amplifying the signal potential of each column CL (bit line pair BL and /BL).

The column selecting circuit 106 shown in FIG. 1 includes a column decoder 234 activated in response to the column address enable signal CDE supplied from the read controller 218 or the write controller 219 shown in FIG. 3, for decoding the Y address (internal column address signal CA) supplied from the column address buffer 103 shown in FIG. 3, and generating a signal to select a corresponding column in the memory cell array 104. The column selecting circuit 106 shown in FIG. 1 further includes IO gates for connecting a corresponding column in the memory cell array 104 to an I/O line 236 in response to the column selecting signal from the column decoder 234. In FIG. 4, the IO gate is not shown.

The input/output circuit 108 shown in FIG. 1 includes a preamplifier 240 activated in response to the preamplifier enable signal PAE supplied from the read controller 218 shown in FIG. 3, for amplifying the internal read data on the I/O line 236 and transmitting the amplified data onto the read data bus 245, an output buffer 242 activated in response to the main amplifier output enable signal OEM from the read controller 218 (refer to FIG. 3), for amplifying the signal on the read data bus 245 and producing an external read data Q and outputting the produced data, an input buffer 244 for latching an external write data D and outputting the latched data onto a write data bus 249 in response to the input data latch signal DIL from the write controller 219 shown in FIG. 3, and a write driver 246 activated in response to the write driver enable signal WDE from the write controller 219 shown in FIG. 3, for outputting the internal write data onto the I/O line 236 according to the internal write data on the write data bus 249.

FIG. 4 shows further a Vbb generator 250, and a Vcc/2 generator 255 together with a Vpp generator 256 for generating the reference voltage of the DRAM. The Vbb generator 250 generates the negative voltage Vbb by the charge pump operation and supplies it to the substrate (or well) region. The negative voltage Vbb is applied to the substrate region, for the following effects. (1) The negative voltage Vbb is applied to a P-type substrate region (well region) where an n-channel MOS transistor (insulated gate type field effect transistor) is formed. Even when undershoot is produced in the signal supplied to an external signal input terminal, injection of electrons from the input terminal to the P-type substrate region is prevented and destruction of the memory cell data due to the electron injection is prevented. (2) The PN junction capacitance formed between the high impurity concentration N+ region and the P substrate region of the n-channel MOS transistor is reduced, and high speed inner operation is accomplished. (3) The substrate effect on the threshold voltage of the n-channel MOS transistor is reduced, and the circuit operation is stabilized. (4) Production of a parasitic MOS transistor formed between the signal line and the substrate region is suppressed.

The Vcc/2 generator 255 generates the potential of ½ of the power source voltage Vcc. The intermediate potential Vcc/2 from the Vcc/2 generator 255 is supplied to the other electrode (cell plate) of the capacitor MQ of the memory cell, and is also utilized when the bit line is precharged to the intermediate potential Vcc/2 at the standby state.

In the configuration shown in FIG. 4, the row system circuits are row decoder 230 and sense amplifier circuit 232. The column system circuits are column decoder 234, preamplifier 240, output buffer 242, and input buffer 244 and write driver 246. The Vbb generator 250, the Vpp generator 256 and the Vcc/2 generator 255 always generates prescribed voltages irrespective of the row system signals and the column system signals.

Figure 5:
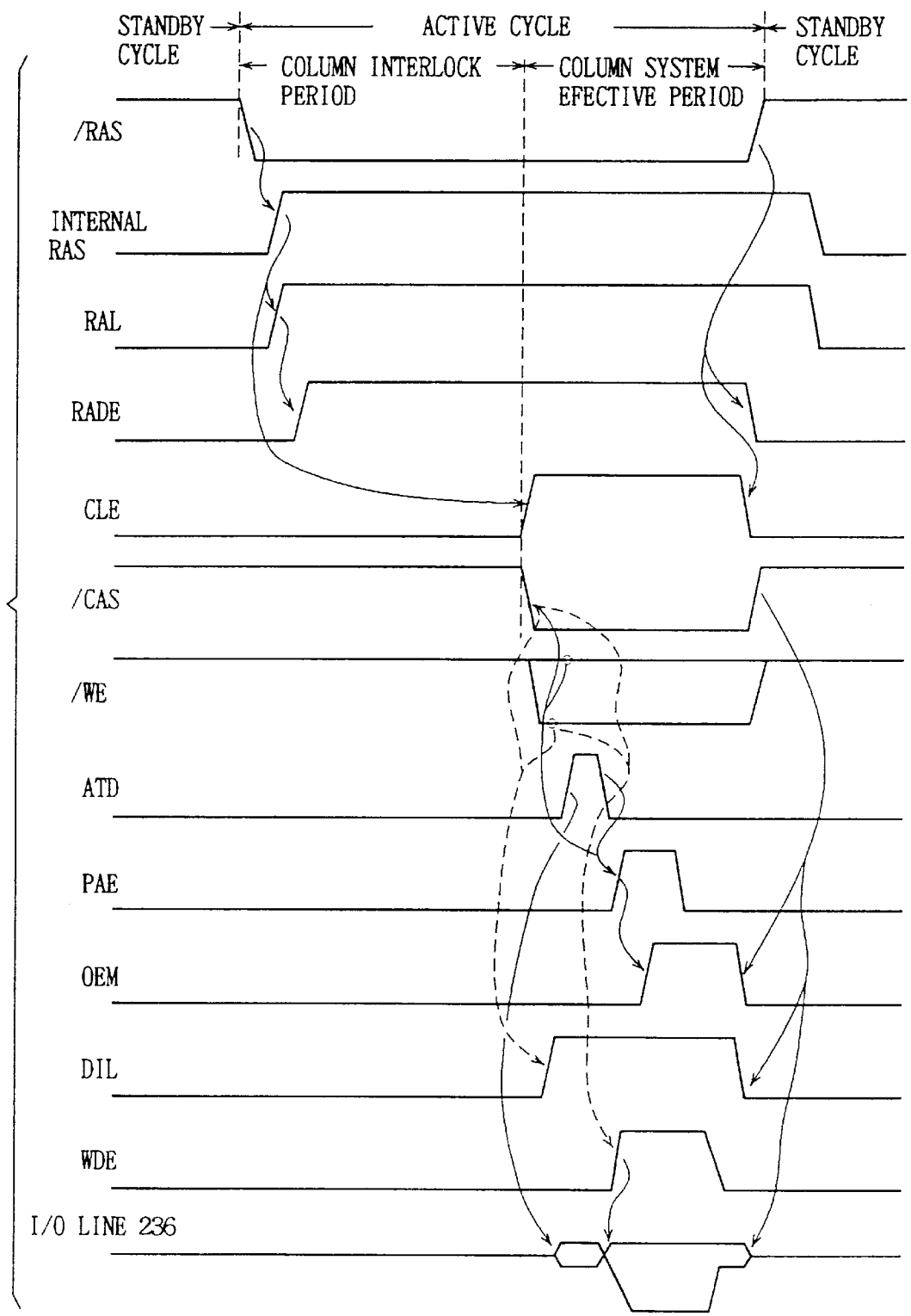
FIG. 5 is a signal waveform chart showing operation of the peripheral circuit of the semiconductor integrated circuit device shown in FIGS. 3 and 4.

FIG. 5 is a diagram showing a generation sequence of control signals shown in FIG. 3 and FIG. 4. Operation of each circuit will be described referring to FIGS. 3 to 5.

In the standby cycle, the external row address strobe signal /RAS is at high level. In this state, the internal RAS signal, the row address latch signal RAL and the row address enable signal RADE are all at low level of the non-active state. Also the column enable signal (interlock signal) CLE to activate the column selection operation is at low level of the non-active state. Also the column address strobe signal /CAS and the write enable signal /WE are at high level. The control signals ATD, PAE, OEM, DIL and WDE of the column system are all at low level of the non-active state. The I/O line is precharged to the prescribed potential (Vcc−Vth) level.

When the row address signal /RAS falls to low level, the active cycle begins. In response to the fall of the row address strobe signal /RAS, the internal RAS signal rises to high level of the active state, and in response to the rise of the internal RAS signal, the row address latch signal RAL rises to high level. In response to the rise of the row address latch signal RAL, the row address buffer 101 shown in FIG. 3 latches applied address signals Ai–A0. Subsequently the row address enable signal RADE becomes the active state of high level, and the X address (internal row address signal RA) corresponding to the latched address signal is generated from the row address buffer 101. Until selection of the word line in the memory cell array 104 according to the X address and rise of the potential of the selected word line to high level and the sense operation by the sense amplifier 232 are all finished, the column enable signal CLE is at low level of the non-active state.

After the operation of all row system circuits is finished and the sense amplifier circuit 232 detects data of the memory cells connected to the selected word line and amplifies and latches the data, the column enable signal CLE rises to high level of the active state. By the rise of the column enable signal CLE to high level, the column interlock period is finished and the column system effective period begins.

In the column system effective period, the column address strobe signal /CAS falls and the column address latch signal CAL and the column address enable signal CADE are made high in level in sequence, and the Y address (internal column address signal CA) is generated from the column address buffer 103. According to the Y address from the column address buffer 103, the address transition detection signal ATD is generated from the ATD circuit 216, and according to the address transition detection signal ATD, the column decoder enable signal CDE is generated from the read controller 218 or the write controller 219. In FIG. 5, for simplification of the drawing, the column address latch signal CAL, the column address enable signal CADE and the column data enable signal CDE are not shown. The column address latch signal CAL and the column address enable signal CADE are generated in response to the internal CAS signal generated according to the column address strobe signal /CAS, and the column decoder enable signal CDE is generated in response to rise of the address transition detection signal ATD.

In response to the column decoder enable signal CDE, the column decoder 234 performs the decode operation of the Y address and selects a column in the memory cell array 104 corresponding to the Y address. Then memory cell data transmitted onto the selected column are transmitted to the I/O line 236 and the potential of the I/O line 236 is changed. The I/O line 236 is released from the precharge state in response to the column decodes enable signal CDE, and is set to the electrically floating state.

Subsequently the preamplifier enable signal PAE rises to high level in response to the fall of the address transition detection signal ATD, and the preamplifier 240 is activated and amplifies the signal appearing on the I/O line 236 and transmits the amplified signal onto the read data bus 245. The main amplifier output enable signal OEM from the read controller 218 rises to high level, and the output buffer 242 is activated and amplifies data on the read data bus 245 and produces external read data Q for outputting them.

On the other hand, in the data write mode, the input data latch signal DIL rises to high level in response to the signals /CAS and /WE, and the input buffer 244 latches the external write data D and transmits the latched data onto the write data bus 249. Subsequently the write driver enable signal WDE rises to high level for a prescribed period in response to the signals /WE and /CAS, and the write driver 246 is activated and produces inner write data from the data on the write data bus 249 and transmits the inner write data onto the I/O line 236.

When the column address strobe signal /CAS rises to high level, the data write/read cycle to one memory cell is finished, and the signals OEM and DIL fall to low level and also the I/O line 236 is restored to the precharge potential.

On the other hand, when the external row address strobe signal /RAS rises to high level, the active cycle is finished, and in response to the rise of the external row address strobe signal /RAS, both the row address enable signal RADE and the column address enable signal CADE become low level of the non-active state. During period from rise of the external row address strobe signal /RAS to high level until fall of the internal RAS signal to low level, all control signals of the row system are restored to the initial state. In the column system effective period, all control signals of the row system maintain the determined state. The column system control signal maintains the initial state during the column interlock period, and is varied in the column system effective period. That is, in the DRAM, both the row system control signal and the column system control signal can be predicted in logic level in a certain operation period, and are activated in order according to a certain sequence.

Embodiment 1

Figure 6:
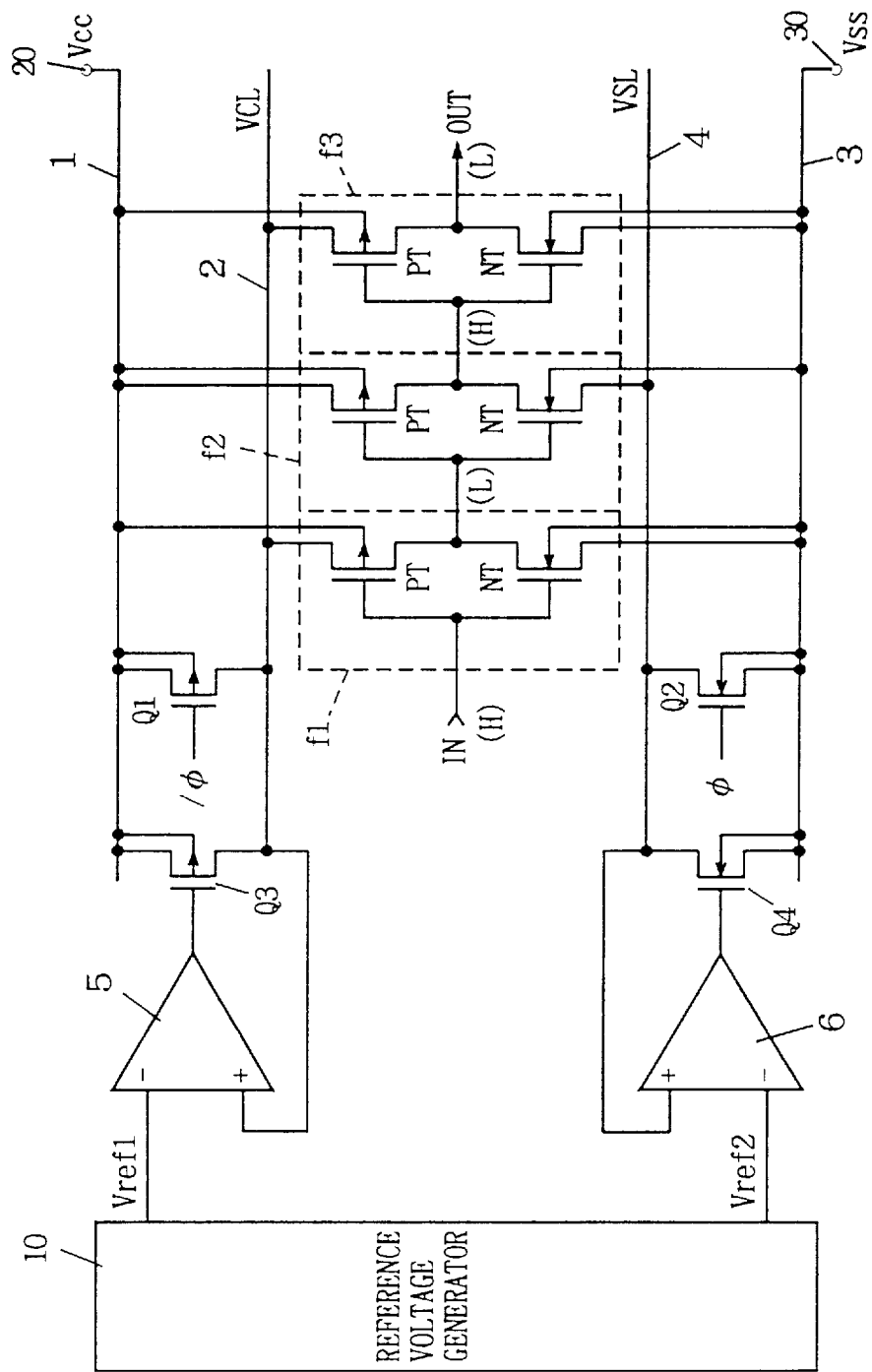
FIG. 6 is a diagram showing a configuration of a main part of the semiconductor integrated circuit device according to the first embodiment of the invention.

FIG. 6 is a diagram showing a configuration of a semiconductor integrated circuit device according to a first embodiment of the present invention. In FIG. 6, circuits included in the peripheral circuits shown in FIG. 3 and FIG. 4 are shown by inverters f1, f2 and f3 representatively. Each of the inverters f1–f3 includes a p-channel MOS transistor PT and an n-channel MOS transistor NT, and has a configuration of a CMOS inverter.

In order to apply the operation power source voltage to the inverters f1–f3, a first main power source voltage transmission line 1 for transmitting the power source voltage Vcc supplied to power source node 20, a first sub power source voltage transmission line 2 arranged in parallel to the first main power source voltage transmission line 1, a second main power source voltage transmission line 3 for transmitting the ground potential 30 supplied to ground node 30, and a second sub power source voltage transmission line 4 arranged in parallel to the second main power source voltage transmission line 3 are provided. In the following description, the first main power source voltage transmission line 1 is simply called the main power source line 1, the first sub power source voltage transmission line 2 is called the sub power source line 2, the second main power source voltage transmission line 3 is called the main ground line 3, and the second sub power source voltage transmission line 4 is called the sub ground line 4.

The inverter f1 operates using the voltage VCL on the sub power source line 2 and the voltage Vss on the main ground line 3 as both operation power source voltages, and the inverter f2 operates using the voltage Vcc on the main power source line 1 and the voltage VSL on the sub ground line 4 as both operation power source voltages, and the inverter f3 operates using the voltage VCL on the sub power source line 2 and the voltage Vss on the main ground line 3 as both operation power source voltages.

The voltage Vcc on the main power source line 1 is applied to the back gate of the p-channel MOS transistor PT of each of the inverters f1–f3, and the voltage Vss on the main ground line 3 is applied to the back gate of the n-channel MOS transistor NT of each of the inverters f1–f3. When the sub power source line 2 and the sub ground line 4 are coupled with the back gates of these MOS transistors PT and NT, decrease of the transition speed of the voltages VCL and VSL due to increase of the parasitic capacitance of the sub power source line 2 and the sub ground line 4 by the substrate junction capacitance is prevented. Also when the voltage VSL rises, the source potential of the n-channel MOS transistor NT becomes higher than the back gate potential, and the threshold voltage of the MOS transistor NT is made higher effectively, thereby reducing the sub-threshold current. Regarding the p-channel MOS transistor PT, the source potential becomes lower than the back gate potential in the standby state, and the threshold voltage becomes further negative and the subthreshold current is reduced.

Regarding the transistors Q1–Q3, the source and the back gate are at the same potential and the back gate effect is eliminated and the threshold voltage is made constant, thereby preventing variation of the switching characteristics.

The p-channel MOS transistor Q1 conducting in response to the operation cycle defining signal /φ and electrically connecting the main power source line 1 and the sub power source line 2 is coupled between the main power source line 1 and the sub power source line 2, and the n-channel MOS transistor Q2 conducting in response to the operation cycle defining signal φ and electrically connecting the main ground line 3 and the sub ground line 4 is coupled between the sub ground line 4 and the main ground line 3.

Further for the main power source line 1 and the sub power source line 2, a differential amplifier 5 for differentially amplifying the voltage on the sub power source line 2 and the reference voltage Vref1 from the reference voltage generating circuit 10, and a p-channel MOS transistor Q3 for supplying current from the main power source line 1 to the sub power source line 2 according to the output signal of the differential amplifier 5 are provided. The differential amplifier 5 receives the voltage on the sub power source line 2 at the positive input, and receives the reference voltage Vref1 from the reference voltage generating circuit 10 at the negative input.

Also for the main ground line 3 and the sub ground line 4, a second differential amplifier 6 for differentially amplifying the voltage VSL on the sub ground line 4 and the reference voltage Vref2 from the reference voltage generating circuit 10 differentially, and an n-channel MOS transistor Q4 for supplying current from the sub ground line 4 to the main ground line 3 in response to the output signal of the differential amplifier 6 are provided. The differential amplifier 6 receives the voltage VSL on the sub ground line 4 at the positive input, and receives the reference voltage Vref2 at the negative input.

Figure 7A:
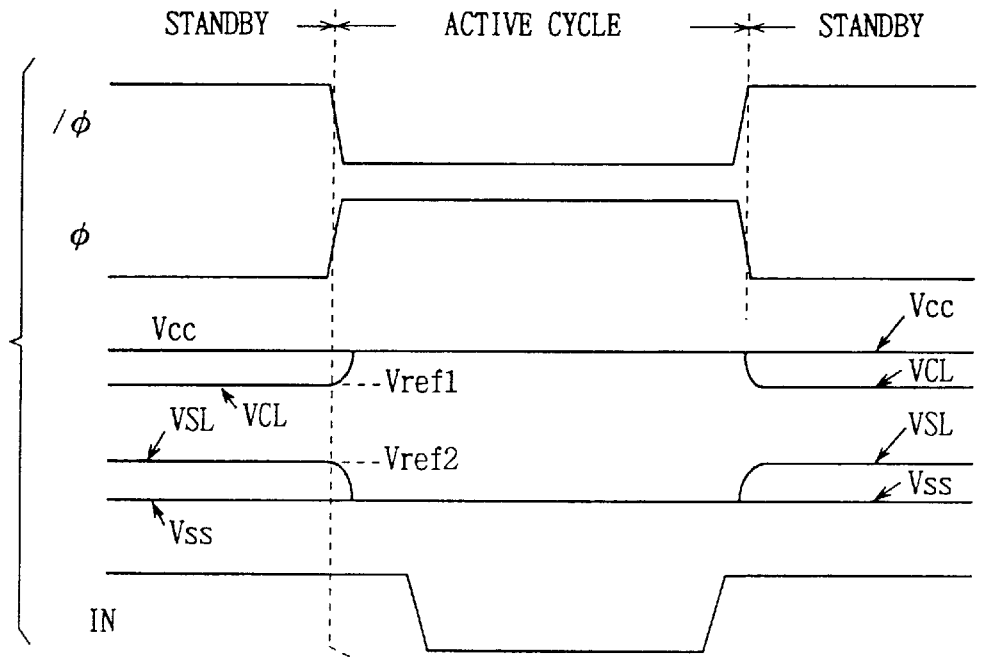
FIGS. 7A through 7C are signal waveform charts showing operation of the semiconductor integrate circuit device shown in FIG. 6.
Figure 7B:
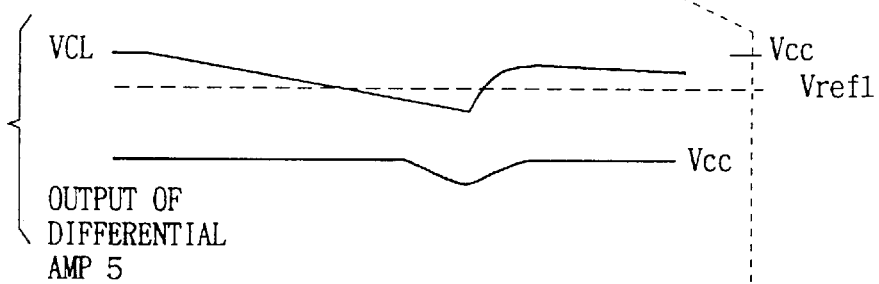
Figure 7C:
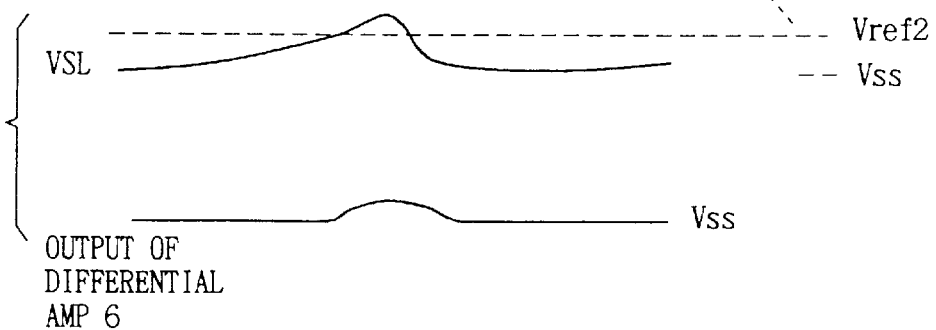

Now, operation of the circuit shown in FIG. 6 will be described referring to FIGS. 7A–7C showing operation waveforms thereof.

The reference voltage Vref1 is at a voltage level close to the power source voltage Vcc, and the reference voltage Vref2 is at voltage level close to the ground potential Vss. At the standby cycle, the operation cycle defining signal /φ is at H level of the power source voltage Vcc level, and the operation cycle defining signal φ is at L level of the ground voltage Vss level. In this state, both MOS transistors Q1 and Q2 are at non-conduction state (OFF-state) (refer to FIG. 7A). In this state, when the power source voltage Vcc on the sub power source line 2 becomes higher than the reference voltage Vref1, the output signal of the differential amplifier 5 is at a high level of the power source voltage Vcc level and the MOS transistor Q3 is turned off (refer to FIG. 7B). On the other hand, when the voltage VCL on the sub power source line 2 becomes lower than the reference voltage Vref1, the output signal of the differential amplifier 5 becomes a low level and the MOS transistor Q3 is turned on and supplies current from the main power source line 1 to the sub power source line 2. When the voltage on the main power source line 2 attains to the VCL again, the MOS transistor Q3 is turned off by the output signal of the differential amplifier 5. Here in FIG. 7B, delay of response is slightly produced by the feedback path of the sub power source line 2, the differential amplifier 5 and the MOS transistor Q3. Consequently, the voltage VCL on the sub power source line 2 is held substantially to the voltage level of the reference voltage Vref1 lower than the power source voltage Vcc level by the MOS transistor Q3 and the differential amplifier 5 at the standby cycle.

On the other hand, as shown in FIG. 7C, when the voltage VSL on the sub ground line is lower than the reference voltage Vref2, the output signal of the differential amplifier 6 becomes L level of the ground potential Vss and the MOS transistor Q4 is turned off. When the voltage VSL becomes higher than the reference voltage Vref2, the output signal of the differential amplifier 6 rises to a high level and the MOS transistor Q4 is turned on and draws current from the sub ground line 4 to the main ground line 3, and the voltage level of the voltage VSL on the sub ground line 4 is lowered. When the voltage VSL becomes the reference voltage Vref2 or less, the MOS transistor Q4 is turned off. Consequently the voltage VSL on the sub ground line 4 is maintained to voltage level of the reference voltage Vref2.

Figure 25:
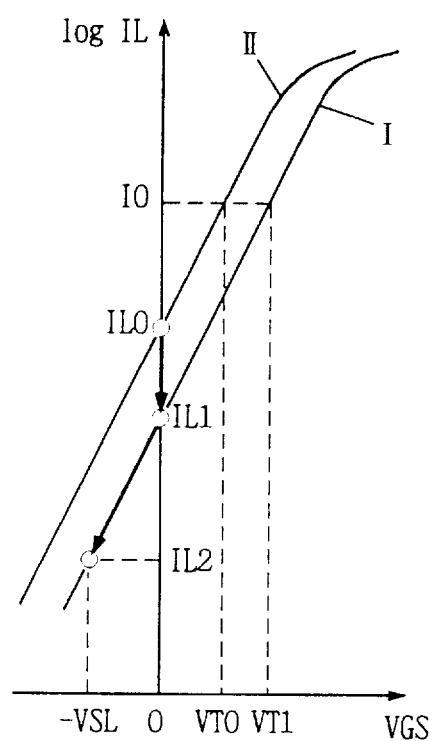
FIG. 25 is a diagram used for explaining a problem of the CMOS inverter in the prior art.

At the standby cycle, the input signal IN is at H level. In this state, in the p-channel MOS transistor PT of the inverter f1, the gate voltage is the Vcc level and the source voltage is the voltage VCL (=Vref1), and the gate-source voltage of the p-channel MOS transistor PT is a negative voltage and the back gate is supplied with the voltage Vcc, so that the p-channel MOS transistor PT is brought to OFF-state more strongly and the subthreshold current is sufficiently reduced as shown in FIG. 25.

To the inverter f2, a signal at L level of the ground potential Vss level is supplied from the inverter f1 by the n-channel MOS transistor NT. Then in the inverter f2, in the n-channel MOS transistor NT, the gate voltage is the ground potential Vss level and the source voltage is the voltage VSL (Vref2), and the gate-source voltage is a negative voltage and the potential of the back gate is the voltage Vss level, so that the n-channel MOS transistor NT is brought into the OFF-state more strongly and the subthreshold current is reduced significantly as clearly seen from FIG. 25.

Also in the inverter f3, a signal at H level of the power source voltage Vcc is supplied from the p-channel MOS transistor PT of the inverter f2, and the p-channel MOS transistor PT of the inverter f3 is brought to the OFF-state more strongly also owing to the effect of the back gate potential, and the subthreshold current is reduced. The n-channel MOS transistor NT is turned on, and when the output node OUT is discharged to L level of the ground potential Vss level, the transistor NT is turned off. Consequently in the inverter series f1–f3, the gate-source voltage of any MOS transistor operating in the subthreshold current region is made negative (regarding nMOS transistor) and the transistor is brought to the OFF-state strongly so that the subthreshold current is sufficiently suppressed. The MOS transistor operating in the active region is turned off when voltage level of its output signal becomes equal to the source voltage. In this state, no current flows. Consequently, by the configuration shown in FIG. 6, the subthreshold current at the standby cycle can be sufficiently suppressed.

Figure 26:
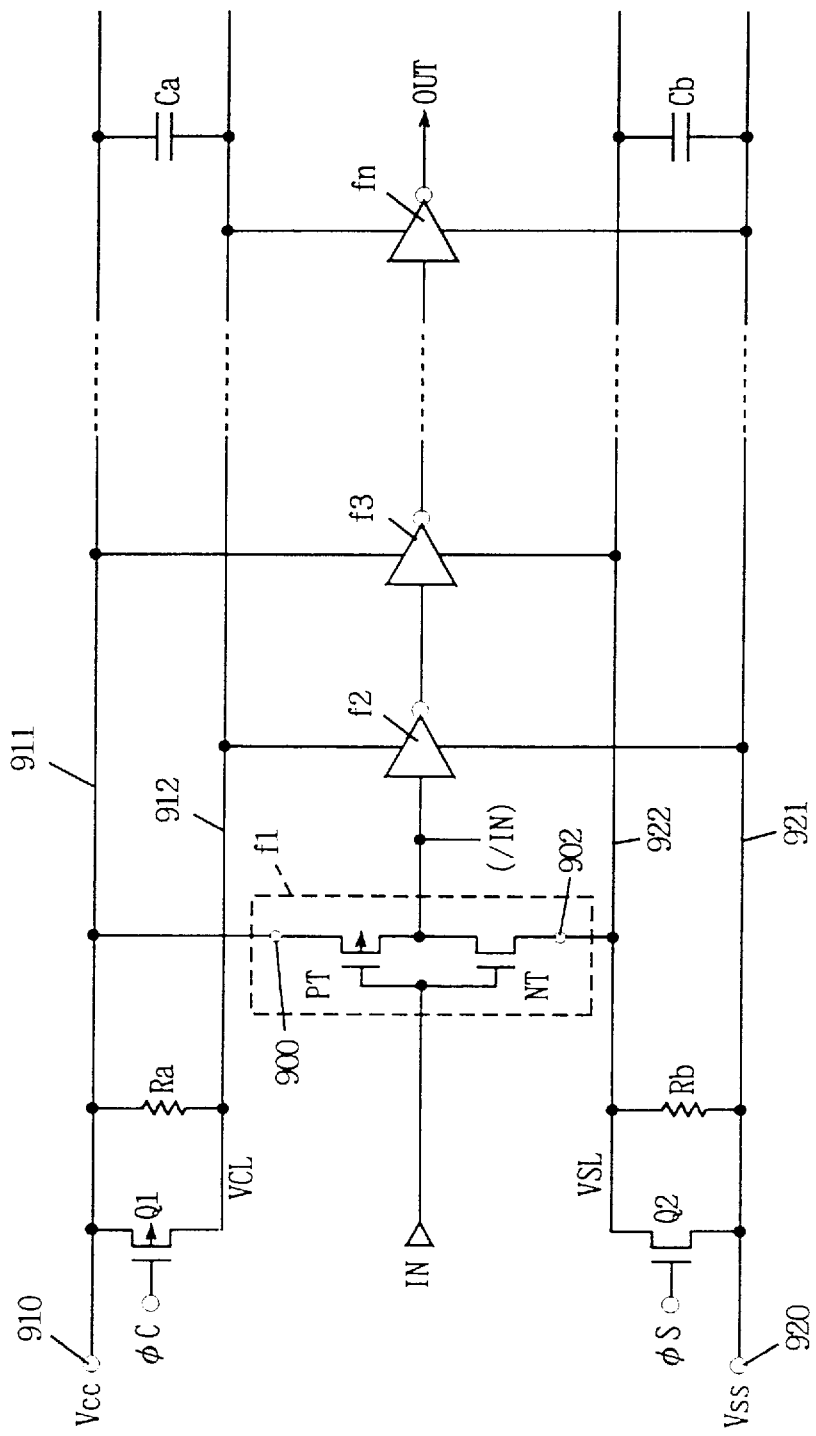
FIG. 26 is a diagram showing a configuration of a main part of a semiconductor integrated circuit device in the prior art.
Figure 27:
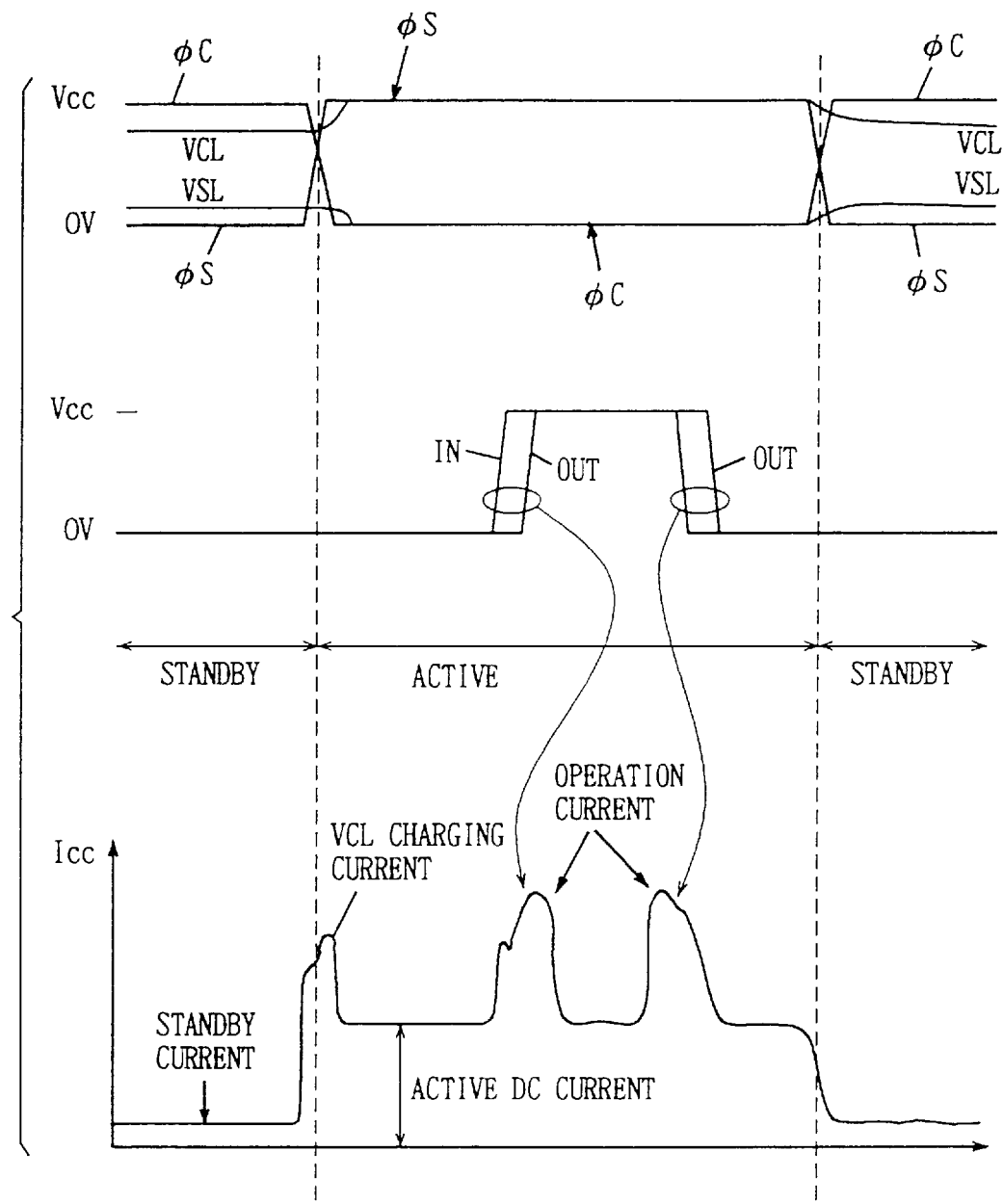
FIG. 27 is a signal waveform chart showing an operation of the semiconductor integrated circuit device in the prior art shown in FIG. 26.

Particularly, the voltage VCL on the sub power source line 2 and the voltage VSL on the sub ground line 4 are maintained to the reference voltages Vref1 and Vref2 using the differential amplifiers 5 and 6. Different from the configuration using the resistors Ra and Rb as shown in FIG. 26 in the prior art, the voltages VCL and VSL can be set to levels of the prescribed voltages Vref1 and Vref2 reliably without being affected by variation of manufacturing parameters, and the voltages VCL and VSL of the sub power source line 2 and the sub ground line 4 can be set stably in the standby cycle. Also by using the reference voltages Vref1 and Vref2, the voltages VSL and VCL can be set to and required voltage level.

At the active cycle, the operation cycle defining signal /φ is brought to L level and the operation cycle specifying signal φ is made H level. Thereby the MOS transistors Q1 and Q2 are turned on, and the main power source line 1 and the sub power source line 2 are connected electrically and the main ground line 3 and the sub ground line 4 are connected electrically. Then since difference between the reference voltage Vref1 and the power source voltage Vcc is small and the voltage VCL is maintained to the voltage level of the reference voltage Vref1 stably by the differential amplifier 5 and the MOS transistor Q3, the sub power source line 2 is restored to the power source voltage Vcc level at high speed within a prescribed time. Also since difference between the reference voltage Vref2 and the ground voltage Vss is small and the voltage VSL is maintained to the voltage level of the reference voltage Vref2 stably by the differential amplifier 6 and the MOS transistor Q4, the voltage VSL of the sub ground line 4 is restored to the voltage level of the ground potential Vss at high speed. Since the voltages VCL and VSL are restored from the reference voltages Vref1 and Vref2 to the voltages Vcc and Vss respectively, the voltage level is held stably without being affected by variation of manufacturing parameters, as compared to configuration using resistor elements as in the prior art. Consequently, time required for the voltages VCL and VSL to restore to the voltages Vcc and Vss can be made constant at the transition from the standby cycle to the active cycle, and margin need not be provided in the operation start timing of each circuit and the input signal IN can be changed at an early timing.

Configuration of Differential Amplifier

Figure 8A:
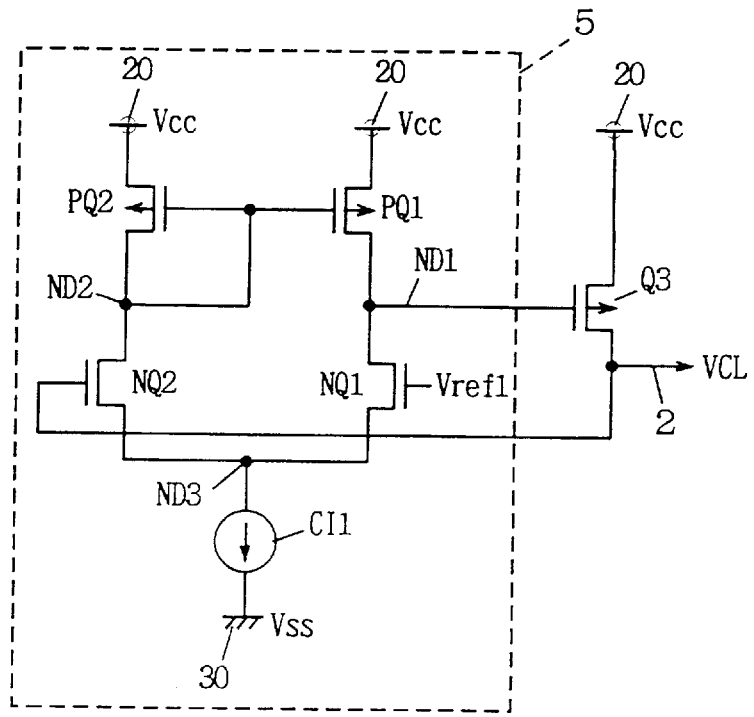
FIGS. 8A and 8B are diagrams showing examples of a configuration of the differential amplifier shown in FIG. 6.
Figure 8B:
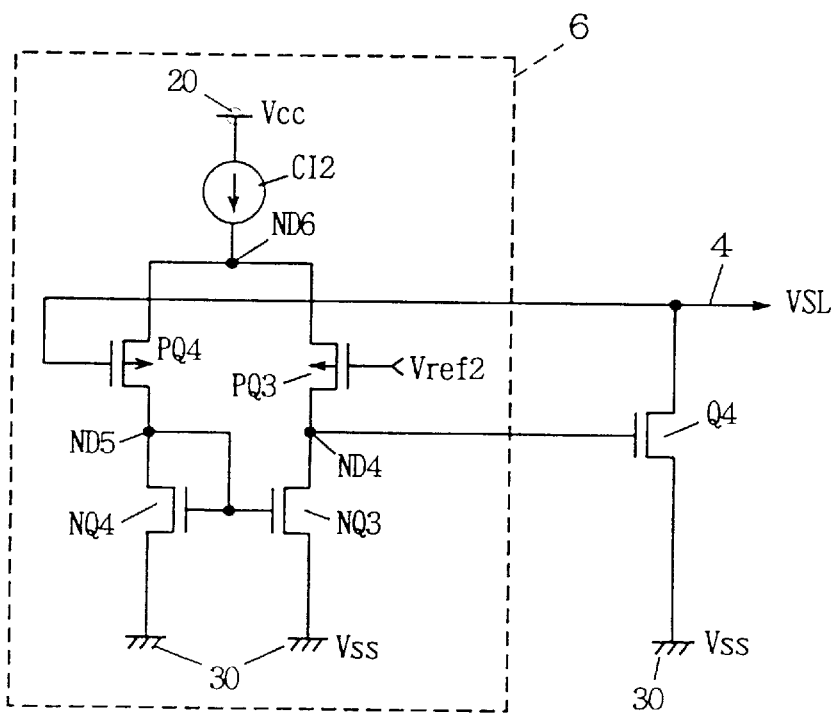

FIGS. 8A and 8B are diagrams showing examples of the configuration of the differential amplifiers shown in FIG. 6. FIG. 8A shows an example of the configuration of the differential amplifier 5 shown in FIG. 6, and FIG. 8B shows an example of the configuration of the differential amplifier 6 shown in FIG. 6.

In FIG. 8A, the differential amplifier 5 includes a p-channel MOS transistor PQ1 connected between power source terminal 20 and an inner node ND1, a p-channel MOS transistor PQ2 connected between the power source terminal 20 and an inner node ND2, an n-channel MOS transistor NQ1 connected between the inner node ND1 and an inner node ND3, and an n-channel MOS transistor NQ2 connected between the inner node ND2 and the inner node ND3. The gate electrodes (control electrode node) of the MOS transistors PQ1 and PQ2 are connected also to the inner node ND2. The gate electrode of the MOS transistor NQ1 is supplied with the reference voltage Vref1, and the gate electrode of the MOS transistor NQ2 is connected to the sub power source line 2.

The differential amplifier 5 further includes a constant-current source CI1 connected between the inner node ND3 and ground terminal 30. In place of the power source terminal 20 and the ground terminal 30, the power source voltage Vcc and the ground voltage Vss may be supplied from the main power source line 1 and the main ground line 3 respectively. The inner node ND1 is connected to the gate electrode of the p-channel MOS transistor Q3. Now, operation of the differential amplifier 5 shown in FIG. 8A will be briefly described.

When the voltage VCL on the sub power source line 2 is higher than the reference voltage Vref1, conductance of the MOS transistor NQ2 becomes higher than that of the MOS transistor NQ1, and a current flowing through the MOS transistor NQ2 becomes larger than a current flowing through the MOS transistor NQ1. The MOS transistors NQ2 and NQ1 are supplied with currents from the MOS transistors PQ2 and PQ1 respectively. The MOS transistors PQ2 and PQ1 constitute a current mirror circuit, and when the MOS transistors PQ1 and PQ2 are equal in size, a current flowing through the MOS transistor PQ1 and a current flowing through the MOS transistor PQ2 are equal in amount with each other. Consequently when conductance of the MOS transistor NQ2 becomes higher and hence a current flowing through the MOS transistors PQ2 and NQ2 becomes larger, a current larger than a current discharged through the MOS transistor NQ1 flows through the MOS transistor PQ1. Thereby the potential of the inner node ND1 rises, and the MOS transistor Q3 is turned off.

When the voltage VCL on the sub power source line 2 becomes lower than the reference voltage Vref1, in reverse, conductance of the MOS transistor NQ2 becomes smaller than that of the MOS transistor NQ1, and a current flowing through the MOS transistor NQ2 becomes smaller than a current flowing through the MOS transistor NQ1. Then by the current mirror circuit of the MOS transistors PQ2 and PQ1, a current supplied to the MOS transistor NQ1 is decreased and the potential of the inner node ND1 is lowered. Thereby conductance of the MOS transistor Q3 becomes larger and a current is supplied from the power source terminal 20 (or main power source line 1) to the sub power source line 2 through the transistor Q3, and level of the voltage VCL rises. By these series of operations, the voltage VCL of the sub power source line 2 is maintained to the voltage level of the reference voltage Vref1.

The differential amplifier 6 as shown in FIG. 8B, includes a constant-current source CI2 connected between a power source terminal 20 (or main power source line 1) and an inner node ND6, a p-channel MOS transistor PQ3 connected between the inner node NQ6 and an inner node ND4, a p-channel MOS transistor PQ4 connected between the inner node ND6 and an inner node ND5, an n-channel MOS transistor NQ3 connected between the inner node ND4 and ground terminal 30 (or main ground line 3), and an n-channel MOS transistor NQ4 connected between the inner node ND5 and the ground terminal 30 (or main ground line 3). The MOS transistor PQ3 receives the reference voltage Vref2 at its gate electrode, and the MOS transistor PQ4 has its gate electrode connected to the sub ground line 4. The gate electrodes of the MOS transistors NQ3 and NQ4 are connected to the inner node ND5. The MOS transistors NQ3 and NQ4 constitute a current mirror circuit, and when the MOS transistors NQ3 and NQ4 are equal in size, a current flowing through the MOS transistor NQ4 and a current flowing through the MOS transistor NQ3 are equal in amount with each other. Now, operation will be described briefly.

When the voltage VSL is higher than the reference voltage Vref2, conductance of the MOS transistor PQ4 becomes smaller than that of the MOS transistor PQ3 and a current supplied to the MOS transistor NQ4 is decreased. On the other hand, a current flowing through the MOS transistor PQ3 becomes larger, but the MOS transistor NQ3 cannot entirely discharge the current supplied from the MOS transistor PQ3, and the voltage level of the inner node ND4 rises and conductance of the MOS transistor Q4 becomes higher, and more current flows from the sub ground line 4 through the main ground line 3 to the ground node terminal 30 and the voltage level of the voltage VSL is lowered.

When the voltage VSL is lower than the reference voltage Vref2, conductance of the MOS transistor PQ4 becomes larger than that of the MOS transistor PQ3 and a large current is supplied to the MOS transistor NQ4. Then a current flowing through the MOS transistor PQ3 is made smaller, and the MOS transistor NQ3 can entirely discharge the current supplied from the MOS transistor PQ3, and the voltage level of the inner node ND4 is lowered and the MOS transistor Q4 is turned off. By these series of operations, the voltage VSL on the sub ground line 4 is maintained to the voltage level of the reference voltage Vref2.

As above described, according to the configuration of the embodiment 1, at the standby cycle, the voltages VCL and VSL of the sub power source line 2 and the sub ground line 4 can be set to the reference voltages Vref1 and Vref2, and the voltages VCL and VSL of the sub power source line 2 and the sub ground line 4 can be maintained to the constant voltage level without being affected by variation of manufacturing parameters, and at transition from the standby cycle to the active cycle, the restoring time of the sub power source line 2 and the sub ground line 4 to the power source voltage Vcc and the ground voltage Vss can be set within a prescribed time and the operation start timing of the circuit can be made earlier.

Embodiment 2

Figure 9:
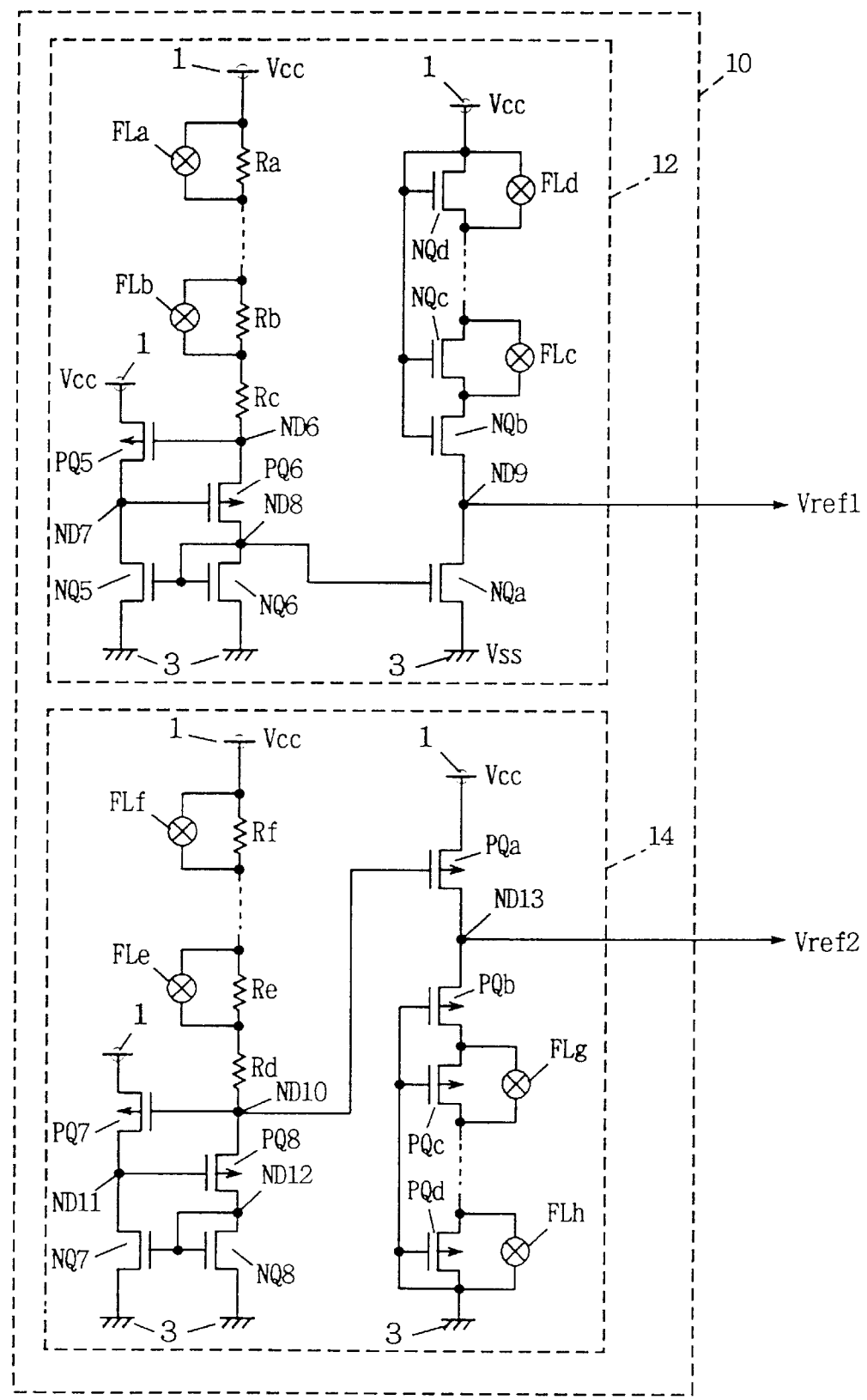
FIG. 9 is a diagram showing a configuration of a ireference voltage generating circuit to be used in a semiconductor integrated circuit device according to a second embodiment of the invention.

FIG. 9 is a diagram showing a specific configuration of the reference voltage generating circuit 10 shown in FIG. 6. In FIG. 9, the reference voltage generating circuit 10 includes a first reference voltage generating circuit 12 for generating the reference voltage Vref1, and a second reference voltage generating circuit 14 for generating the reference voltage Vref2. In FIG. 9, the first and second reference voltage generating circuits 12 and 14 are supplied with the power source voltage Vcc and the ground voltage Vss from the main power source line 1 and the main ground line 3 respectively. In this case, such configuration may be utilized that the power source voltage Vcc and the ground voltage Vss are supplied from the power source terminal 20 and the ground terminal 30 through separate interconnection lines respectively.

At first, the first reference voltage generating circuit 12 will be described of its configuration and operation, and subsequently the second reference voltage generating circuit 14 will be described of its configuration and operation.

The first reference voltage generating circuit 12 includes resistors Ra . . . Rb and Rc connected in series between the main power source line 1 and an inner node ND6, fusible link elements FLa–FLb of low resistance connected in parallel to the resistors Ra–Rb, a p-channel MOS transistor PQ5 connected between the main power source line 1 and an inner node ND7 and having its gate electrode connected to the inner node ND6, a p-channel MOS transistor PQ6 connected between the inner node ND6 and an inner node ND8 and having its gate electrode connected to the inner node ND7, an n-channel MOS transistor NQ5 connected between the inner node ND7 and the main ground line 3 and having its gate electrode connected to the inner node ND8, and an n-channel MOS transistor NQ6 connected between the inner node ND8 and the main ground line 3 and having its gate electrode connected to the inner node ND8. The MOS transistor PQ5 has larger current supply capability (larger mutual conductance $\beta$) than that of the MOS transistor NQ5. Also the MOS transistor PQ5 together with the MOS transistor PQ6 has larger current drive capability than that of the MOS transistors NQ5 and NQ6.

The first reference voltage generating circuit 12 further includes n-channel MOS transistors NQb, NQc . . . NQd connected in series between the main power source line 1 and an inner node ND9, fusible link elements FLc–FLd connected in parallel to the MOS transistors NQc–NQd, and an n-channel MOS transistor NQa connected between the inner node ND9 and the main ground line 3 and having its gate electrode connected to the inner node ND8. The gate electrode of the MOS transistors NQb–NQd is connected to the main power source line 1, and these MOS transistors NQb–NQd function as resistor elements. Now, operation will be described.

The MOS transistor PQ5 has much larger current drive capability than that of the MOS transistor NQ5, and has the gate-source voltage set to the absolute value of the threshold voltage at the conductive state. That is, the voltage between the main power source line 1 and the inner node ND6 becomes Vthp. Here, Vthp shows the absolute value of the threshold voltage of the MOS transistor PQ5. The inner node ND6 is supplied with a current by the resistors Ra–Rc and the link elements SLa–SLb. Now, if combined resistance of the resistors Ra–Rc and the link elements SLa–SLb is assumed R, the current I flowing in the inner node ND6 is given by $$I = Vthp/R$$

The current I flowing in the inner node ND6 flows through the MOS transistors PQ6 and NQ6. A mirror current of the current flowing through the MOS transistor NQ6 flows through the MOS transistors NQ5 and NQa respectively. If current flowing through the MOS transistor NQa is assumed In and combined resistance of the part constituted by the MOS transistors NQb–NQd and the link elements FLc–FLd is assumed Rn, the reference voltage Vref1 is given by following formula.

$$Vref1 = Vcc - In \cdot Rn$$

The current In is a mirror current of the current I and is a constant current. Consequently, difference between the power source voltage Vcc and the reference voltage Vref1 becomes In·Rn being constant value, and the reference voltage Vref1 to maintain a required value can be produced.

If ratio of the current I flowing through the MOS transistor NQ6 and the current In flowing through the MOS transistor NQa is assumed n, the reference voltage Vref1 is given by following formula.

$$Vref1 = Vcc - n \cdot Vthp \cdot Rn/R$$

The resistance values R and Rn can be adjusted by programming (fusing) of the link elements FLa–FLb and FLc–FLd. If the link elements FLa–FLb are blown off by a suitable number, the resistance value R becomes larger and the reference voltage Vref1 becomes higher. On the other hand, if the link elements FLc–FLd are blown off by a suitable number, the resistance value Rn becomes larger and the reference voltage Vref1 becomes lower. The voltage level of the reference voltage Vref1 can be optimized, so that the leak current at the standby cycle is minimized and the restoring time of the voltage VCL in the transition from the standby cycle to the active cycle is minimized.

The constant-current generating operation by the circuit part including the MOS transistors PQ5, PQ6, NQ5 and NQ6 will be descried more in detail in the following. In the normal state, a mirror current of the current flowing through the MOS transistors PQ6 and NQ6 flows through the MOS transistors PQ5 and NQ5, and the gate-source voltage of the MOS transistor PQ5 is held to the constant value. When the current flowing through the MOS transistors PQ6 and NQ6 increases, also the current flowing through the MOS transistors PQ5 and NQ5 increases. The voltage level of the inner node ND6 is lowered, the MOS transistor PQ5 supplies a current larger than that flowing through the MOS transistor NQ5, and the voltage level of the node ND7 rises. Thereby the current flowing through the MOS transistor PQ6 decreases, and the voltage level of the node ND6 is restored to the prescribed voltage level.

In reverse, when the current flowing through the MOS transistors PQ6 and NQ6 decreases, also the current flowing through the MOS transistors PQ5 and NQ5 decreases. Then the voltage level of the node ND6 rises higher than the prescribed voltage level, the current flowing through the MOS transistor PQ5 is made smaller, and the node ND7 is discharged through the MOS transistor NQ5 and the voltage level is lowered. Conductance of the MOS transistor PQ6 is enlarged and the voltage level of the node ND6 is lowered to the prescribed voltage level. Thereby the gate-source voltage of the MOS transistor PQ5 is held to the constant threshold voltage Vthp level, and the current flowing through the MOS transistors PQ5 and NQ6 is made constant.

The second reference voltage generating circuit 14 includes resistors Rd, Re . . . Rf connected in series between an inner node ND10 and the main power source line 1, fusible link elements FLe–FLf connected in parallel to the resistors Re–Rf, a p-channel MOS transistor PQ7 connected between the main power source line 1 and an inner node ND11 and having its gate electrode connected to the inner node ND10, a p-channel MOS transistor PQ8 connected between the inner node ND10 and an inner node ND12 and having its gate electrode connected to the inner node ND11, an n-channel MOS transistor NQ7 connected between the inner node ND12 and the main ground line 3 and having its gate electrode also connected to the inner node ND12, and an n-channel MOS transistor NQ7 connected between the inner node ND11 and the main ground line 3 and having its gate electrode connected to the inner node ND12. The circuit part including these resistors Rd–Rf, the link elements FLe–FLf and the MOS transistors PQ7, PQ8, NQ7 and NQ8 has the same configuration as that of the circuit part included in the first reference voltage generating circuit 14 for generating a constant current, and operates in similar manner.

The second reference voltage generating circuit 14 further includes a p-channel MOS transistor PQa connected between the main power source line 1 and an inner node ND13 and having its gate electrode connected to the inner node ND10, p-channel MOS transistors PQb, PQc . . . PQd connected in series between the inner node ND13 and the main ground line 3, and link elements FLg–FLh connected in parallel to the MOS transistors PQc–PQd. The gate electrode of the MOS transistors PQb–PQd is connected to the main ground line 3. These MOS transistors PQb–PQd all operate as resistor elements. Now, operation will be described.

The voltage level of the node ND10 becomes Vcc–Vthp in similar manner to the case of the first reference voltage generating circuit 12. Here, Vthp shows the absolute value of the threshold voltage of the MOS transistor PQ7. The MOS transistor PQa receives the voltage of the node ND10 at its gate electrode, and supplies a constant current from the main power source line 1. The current supplied from the MOS transistor PQa is supplied to the circuit part of the MOS transistors PQb–PQd and the link elements FLg–FLh, and the constant voltage is generated at the node ND13. If the current supplied by the MOS transistor PQa is assumed Ia and the resistance provided by the circuit part of the MOS transistors PQb–PQd and the link elements FLg–FLh is assumed Rs, the reference voltage Vref2 generated at the node ND13 is given by following formula.

$$Vref2 = Ia \cdot Rs + Vss$$

The ground potential Vss is 0 V, and the reference voltage Vref2 becomes Ia·Rs. If the number of blown off link elements among the link elements FLg–FLh increases, the resistance value Rs of the circuit part in the MOS transistors PQb–PQd increases and the reference voltage Vref2 rises. On the other hand, since the gate electrode of the MOS transistor PQa is connected to the node ND10, the current Ia is determined by the current flowing through the circuit part including the resistors Rd–Rf and the link elements FLd–FLe in similar manner to the MOS transistor PQ7. Consequently, if the number of blown off link elements among the link elements FLe–FLf decreases, the resistance value of this part decreases and hence the current Ia increases. Consequently, if the number of blown off link elements among the link elements FLe–FLf increases, the current Ia is decreased and the voltage level of the reference voltage Vref2 is lowered. Thereby the reference voltage Vref2 can be set to a suitable voltage level.

As above described, function of adjusting the reference voltages Vref1 and Vref2 to suitable voltage levels is provided, so that the reference voltages of a required voltage levels can be applied to the sub power source line 2 and the sub ground line 4, and both Vcc–Vref1 and Vref2–Vss can be made constant. At a product test of the semiconductor memory device, the standby current is monitored a nd the voltage levels of the reference voltages Vref1 and Vref2 are set. While the minimum standby current is realized, the reference voltages Vref1 and Vref2 can be made as close as possible to the power source voltage Vcc and the ground voltage Vss respectively. Thereby at the restoring from the standby cycle to the active cycle, the time of restoring of voltages VCL and VSL to the power source voltage Vcc and the ground voltage Vss respectively can be made as short as possible.

Embodiment 3

Figure 10:
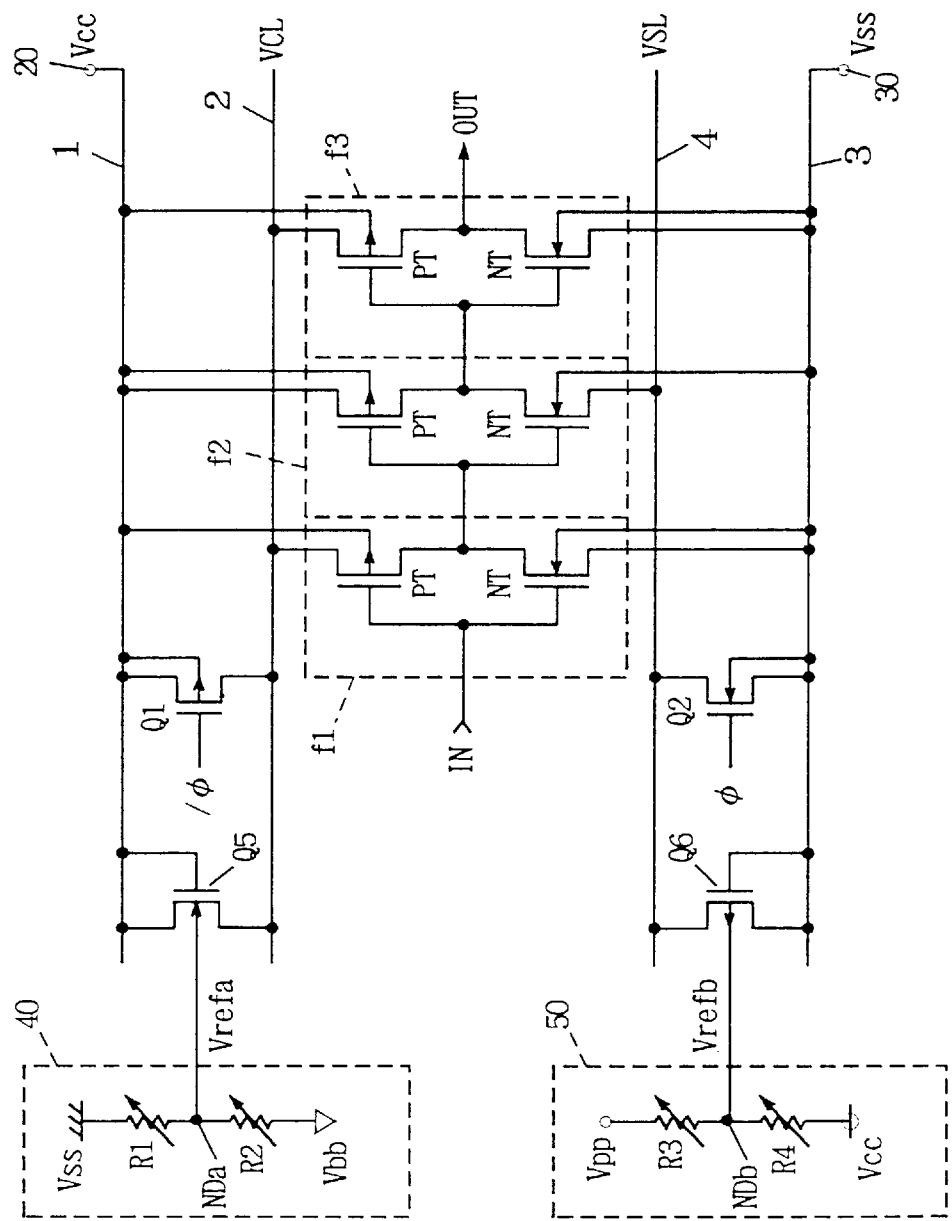
FIG. 10 is a diagram showing a configuration of a main part of a semiconductor integrated circuit device according to the third embodiment of the invention.

FIG. 10 is a diagram showing a configuration of a main part of a semiconductor integrated circuit device according to a third embodiment of the present invention. In the configuration shown in FIG. 10, to a main power source line 1 and a sub power source line 2, a reference voltage generating circuit 40 for generating a reference voltage Vrefa, and an n-channel MOS transistor Q5 receiving the reference voltage Vrefa from the reference voltage generating circuit 40 at its back gate and having one conduction terminal and a control electrode node connected to the main power source line 1 and other conductive node connected to the sub power source line 2 are provided. Also, to a main ground line 3 and a sub ground line 4, provided are a reference voltage generating circuit 50 for generating a reference voltage Vrefb, and a p-channel MOS transistor Q6 receiving the reference voltage Vrefb from the reference voltage generating circuit 50 at its back gate and having one conduction node and a control electrode node connected to the main ground line 3 and other conduction node connected to the sub ground line 4.

Also in FIG. 10, the voltage Vcc on the main power source line 1 is applied to back gate of each p-channel MOS transistor PT of inverters f1–f3, and the voltage Vss on the main ground line 3 is applied to back gate of each n-channel MOS transistor NT. Effects similar to that in the configuration shown in FIG. 6 are realized. The voltage Vcc on the main power source line 1 and the voltage Vss on the main ground line 3 are applied to back gates of the transistors Q1 and Q2 respectively.

The reference voltage generating circuit 40 includes variable resistors R1 and R2 connected in series between a node supplying the ground voltage Vss and a node supplying the negative voltage Vbb. The negative voltage Vbb is supplied from the negative voltage generating circuit 250 shown in FIG. 1. The reference voltage generating circuit 50 includes variable resistors R3 and R4 connected in series between a node supplying the high voltage Vpp and a node supplying the power source voltage Vcc. Resistance ratio of the variable resistors R1 and R2 and that of the variable resistors R3 and R4 are set to suitable values respectively, and values of the reference voltages Vrefa and Vrefb can be adjusted.

The MOS transistors Q5 and Q6 operate as diodes. That is, at the OFF-state of the MOS transistor Q1 (standby cycle), the voltage VCL on the sub power source line 2 is held to the voltage level of Vcc–Vthn by the MOS transistor Q5. On the other hand, at the OFF-state of the MOS transistor Q2 (standby cycle), the voltage VSL on the sub ground line 4 is held to the voltage level of Vthp by the MOS transistor Q6. Here Vthn shows the threshold voltage of the MOS transistor Q5, and Vthp shows the absolute value of the threshold voltage of the MOS transistor Q6. In general, the threshold voltage Vt of a MOS transistor is given by following formula.

$$Vt = A + B(C + |Vsub|)^{1/2}$$

Here, A, B and C are constants determined by various parameters of the transistor. Also Vsub shows the substrate bias voltage applied to the back gate (substrate region) of the MOS transistor. That is, if the absolute value of the substrate bias voltage Vsub is enlarged, the absolute value of the threshold voltage Vt is enlarged. The reference voltages Vrefa and Vrefb are given by following formulas.

$$Vrefa = R1 \cdot Vbb/(R1+R2)$$

$$Vrefb = (R3 \cdot Vcc + R4 \cdot Vtp)/(R3+R4)$$

Here, the ground voltage Vss is assumed 0 V. Consequently, if the resistance values R1–R4 of the variable resistors R1–R4 are set suitably, the values of the reference voltages Vrefa and Vrefb can be set to suitable values, and hence the threshold voltages Vthn and Vthp of the MOS transistors Q5 and Q6 can be set to suitable values.

Figure 11:
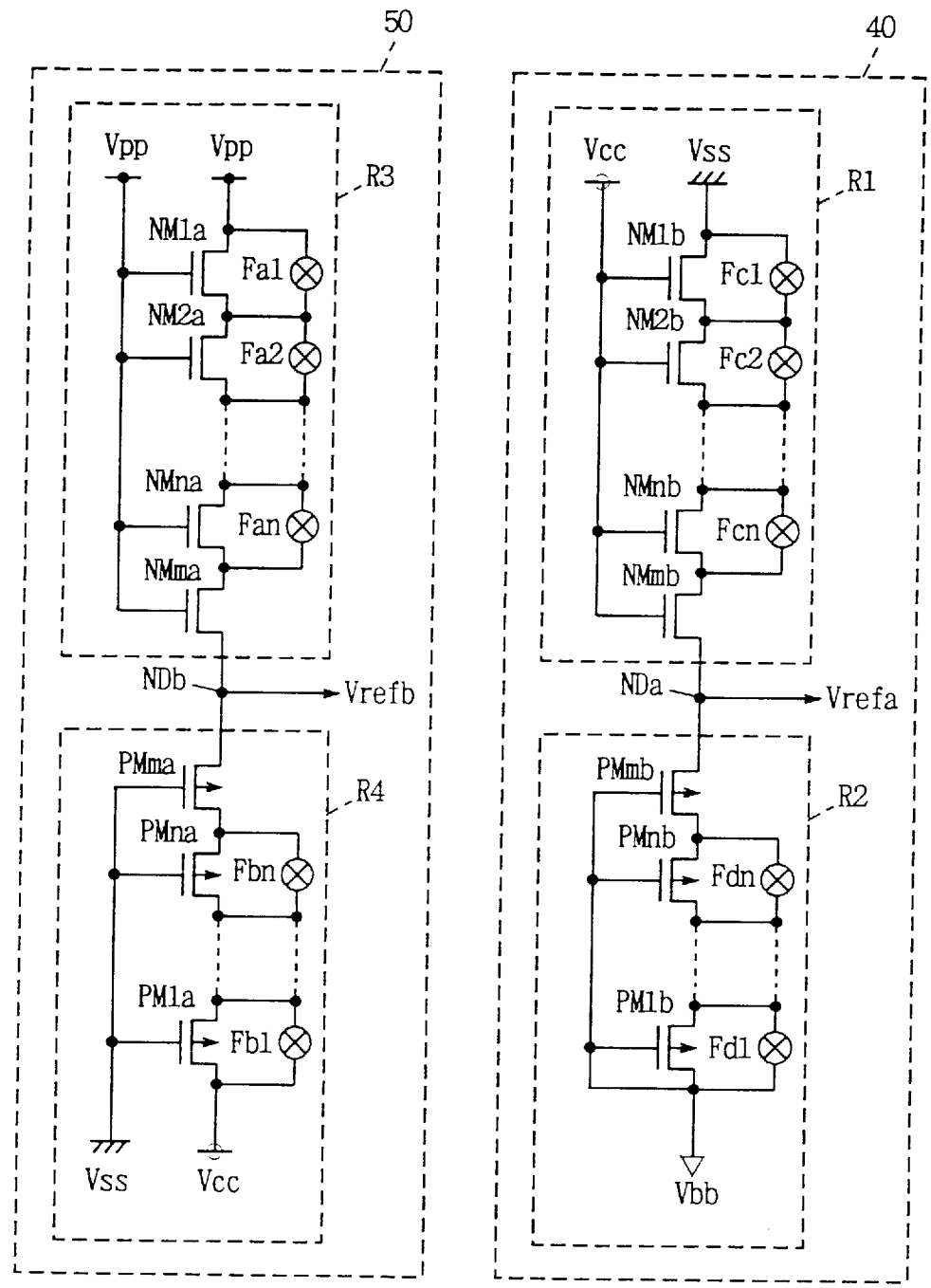
FIG. 11 is a diagram showing an example of a configuration of the reference voltage generating circuit shown in FIG. 10.

FIG. 11 is a diagram showing an example of a general configuration of the reference voltage generating circuits 40 and 50 shown in FIG. 10. In FIG. 11, a variable resistor R3 included in the reference voltage generating circuit 50 includes n-channel MOS transistors NM1a–NMma connected in series between a high voltage Vpp applying node and an output node NDb, and link elements Fa1–Fan provided in parallel to the MOS transistors NM1a–NMna. A variable resistor R4 includes p-channel MOS transistors PM1a–PMna connected in series between a power source voltage Vcc applying node and the output node NDb, and link elements Fb1–Fbn connected in parallel to the MOS transistors PM1a–PMna. The gate electrodes of the MOS transistors NM1a–NMma are connected to the high voltage Vpp applying node, and these MOS transistors NM1a–NMma act as resistor elements. The gate electrodes of the MOS transistors PM1a–PMma are connected to a ground voltage Vss supply node, and these MOS transistors PM1a–PMma act as resistor elements. The link elements Fa1–Fan and Fb1–Fbn short-circuit the corresponding MOS transistors when conductive. These link elements Fa1–Fan and Fb1–Fbn are blown off suitably, so that the resistance values of the variable resistors R3 and R4 can be set to suitable values, and hence the voltage level of the reference voltage Vrefb can be set to a required voltage level. If link elements Fa1–Fan are blown off, the voltage level of the reference voltage Vrefb is lowered, and if the link elements Fb1–Fbn are blown off, the voltage level of the reference voltage Vrefb rises.

In the reference voltage generating circuit 40, a variable resistor R1 includes n-channel MOS transistors NM1b–NMmb connected in series between the ground potential Vss supply node and the output node NDa, and link elements Fc1–Fcn connected in parallel to the MOS transistors NM1b–NMnb. The link elements Fc1–Fcn short circuit the corresponding MOS transistors when conductive. The gate electrodes of the MOS transistors NM1b–NMmb are connected to the power source voltage Vcc applying node, and the MOS transistors NM1b–NMmb act as resistor elements.

A variable resistor R2 includes p-channel MOS transistors PM1b–PMmb connected in series between the negative voltage Vbb applying node and the output node NDa, and fusible link elements Fd1–Fdn of low resistance connected in parallel to the MOS transistors PM1b–PMnb. The gate electrodes of the MOS transistors PM1b–PMmb are connected to receive the negative potential Vbb. If link elements Fc1–Fcn are blown off the resistance value of the variable resistor R1 increases. If the link elements Fd1–Fdn are blown off, thereby the resistance value of the variable resistor R2 increases. If link elements Fc1–Fcn are blown off selectively, the voltage level of the reference voltage Vrefa is lowered. On the other hand, if the link elements Fd1–Fdn are blown off the voltage level of the reference voltage Vrefa is raised.

As shown in FIG. 11, the voltage level of the reference voltages Vrefa and Vrefb is adjusted by the link elements Fa1–Fan, Fb1–Fbn, Fc1–Fcn and Fd1–Fdn. Thus, even if the threshold voltage of the MOS transistors Q5 and Q6 shown in FIG. 10 is varied due to variation of manufacturing parameters, the variation of the threshold voltage can be easily compensated for and the voltages VCL and VSL can be set to the prescribed voltage levels. Also at the chip test, a current consumption at the standby cycle is monitored and the selective blown-off of the link elements Fa1–Fan is executed, so that the standby current is reduced and also the voltages VCL and VSL can be set to values as close as possible to the power source voltage Vcc and the ground voltage Vss respectively, and the restoring time of the voltages VCL and VSL at the transition from the standby cycle to the active cycle can be shortened.

Figure 12:
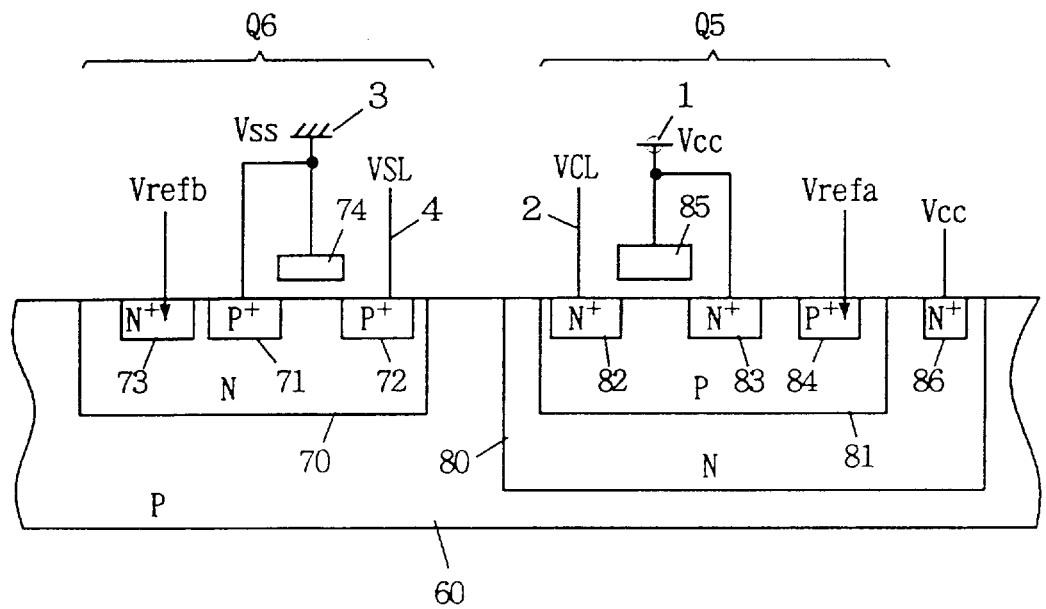
FIG. 12 is a diagram showing schematically a sectional structure of an insulated gate type field effect transistor shown in FIG. 10.

FIG. 12 is a diagram schematically showing a sectional structure of the MOS transistors Q5 and Q6 shown in FIG. 10. In FIG. 12, the MOS transistor Q5 is formed within a P-type well 81 formed on a surface of an N-type well 80 formed on a surface of a P-type semiconductor substrate 60. The MOS transistor Q5 includes N (N+) type impurity regions 82 and 83 of high impurity concentration formed with spacing from each other on the surface of the P-type well 81, and a gate electrode 85 formed on a region (channel region) between the impurity regions 82 and 83 with a gate insulation film (not shown) thereunder. The P-type well 81 acts as a back gate of the MOS transistor Q5, and receives the reference voltage Vrefa through a P-type impurity region 84 of high impurity concentration. The gate electrode layer 85 and the impurity region 83 are connected together to the main power source line 1. The impurity region 82 of the MOS transistor Q5 is connected to the sub power source line 2. The power source voltage Vcc is applied to the N-type well 80 through an N-type impurity region 86 of high impurity concentration. PN junction between the P-type well 81 and the N-type well 80 is maintained in a reverse bias state, and generation of a leak current from the P-type well 81 to the substrate 60 is prevented. Such configuration may be utilized that the negative voltage Vbb is applied to the P-type substrate 60.

The MOS transistor Q6 is formed within an N-type well 70 formed on a surface of the P-type semiconductor substrate 60. The MOS transistor Q6 includes P-type impurity regions 71 and 72 of high impurity concentration formed with spacing from each other on the surface of the N-type well 70, and a gate electrode layer 74 formed on a region (channel region) between the impurity regions 71 and 72 with a gate insulation film (not shown) thereunder. The N-type well 70 acts as a back gate of the MOS transistor Q6, and receives the reference voltage Vrefb through an N-type impurity region 73 of high impurity concentration. The gate electrode layer 74 and the impurity region 71 are connected together to the main ground line 3. The impurity region 72 is connected to the sub ground line 4.

As shown in FIG. 12, the triple well structure (using both N-type well and P-type well) is employed, and the prescribed reference voltages Vrefa and Vrefb can be applied to the MOS transistors Q5 and Q6 respectively without affecting each other. Switching transistors Q1 and Q2 are arranged close to the MOS transistors Q5 and Q6 respectively, and the substrate bias voltage can be applied also to these switching transistors Q1 and Q2 being different from each other in the conduction type without affecting each other.

Figure 13:
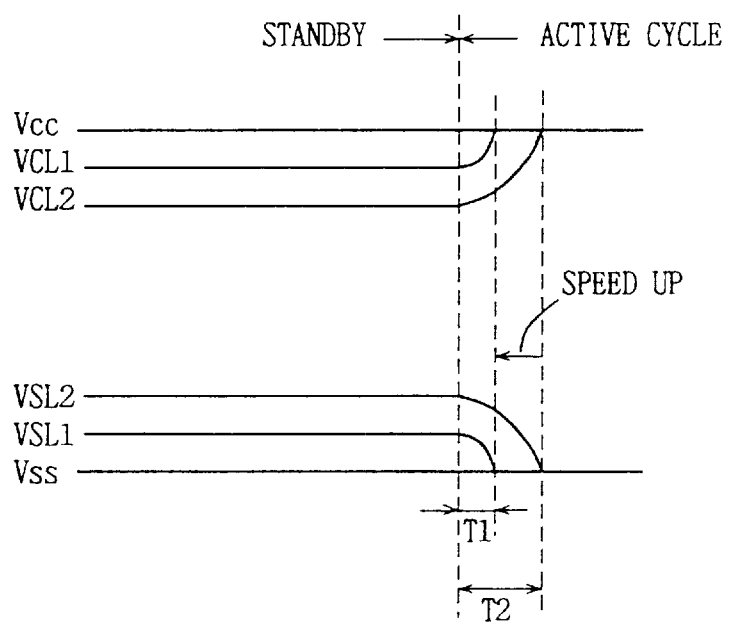
FIG. 13 is a diagram used for explaining the effect of the second and third embodiments.

FIG. 13 is a diagram for explaining the effects of the first to third embodiments. As shown in FIG. 13, when the voltages VCL and VSL are at the voltage levels VCL1 and VSL1, these are restored to levels of the power source voltage Vcc and the ground voltage Vss in relatively short time T1. On the other hand, when the voltages VCL and VSL are at the voltage levels of VCL2 and VSL2, the sub power source line and the sub ground line are charged and discharged at the same speed but time T2 is required until restoring to prescribed levels of the power source voltage Vcc and the ground voltage Vss. Consequently, at the transition from the standby cycle to the active cycle, if the voltages VCL and VSL are set to VCL1 and VSL1 respectively, the relevant circuit can be made operative at an earlier timing at the active cycle. In this case, however, the subthreshold current increases a little in comparison with the case of the voltage levels of VCL2 and VSL2. Consequently, as in the first to third embodiments, the level of the threshold voltage is adjusted so that the operation speed and the subthreshold current can be optimized.

Embodiment 4

FIG. 14 is a diagram schematically showing a configuration of a main part of a semiconductor integrated circuit device according to the fourth embodiment of the present invention. When a defective memory cell exists in the memory cell array 100 shown in FIG. 1 or the memory cell array 104 shown in FIG. 4, the defective memory cell is replaced by a redundant memory cell, so that the defective memory cell is repaired effectively. A redundant circuit is provided to replace the defective memory cell. In FIG. 14, as such a redundant circuit, a configuration of a redundant circuit to replace a row is shown. In FIG. 14, the row redundant circuit includes a spare decoder 91 for storing an address (defective address) specifying an existing defective memory cell and being activated when the applied address signals X1–Xn designate a defective row and making a corresponding spare word line SWL active. Redundant memory cells of one row to be replaced by memory cells of one row connecting a defective memory cell are connected to the spare word line SWL. Apart from the redundant circuit, a normal decoder 94 for decoding the address signals X1–Xn and selecting memory cells of a corresponding one row in the memory cell array is provided. The normal decoder 94 is made non-active when the spare decoder 91 is active.

The spare decoder 91 includes a program circuit 93 for storing a defective row address and producing a signal in active state when the address signals X1–Xn designate the defective row address, and a spare driver 92 for driving the spare word line SWL to active state in response to the active signal from the program circuit 93. The program circuit 93 includes a precharge transistor 93a for precharging an inner node Nx to the level of the power source voltage Vcc in response to a precharge signal PR, n-channel MOS transistors 93b, 93c, . . . 93m provided in parallel to each other for receiving address signals X1–Xn at respective gate electrodes, and fusible link elements L1–Ln provided between the MOS transistors 93b 93m and the inner node Nx respectively. The precharge signal PR is brought to L level at the standby cycle, and turns the precharge transistor 93a on. For example, the program of the link elements L1–Ln is carried out as follows. A link element provided for a MOS transistor receiving an address signal corresponding to a defective row address is blown off. When the defective row address is designated, a signal supplied to a gate of a MOS transistor connected to the inner node Nx through the link element is at L level. When a row address other than the defective row address is designated, among address signals supplied to the program circuit 93, at least one of signals supplied to the gates of the MOS transistors connected to the non-fused link elements is at H level. Consequently, at the active cycle, when the address signals X1–Xn are supplied and the defective row address is designated, the MOS transistors connected to the inner node Nx is turned off, and the inner node Nx is maintained to the voltage level of the precharge voltage Vcc level (or high voltage Vpp may be used). On the other hand, when a row address other than the defective row address is designated, at least one among the MOS transistors connected to the inner node Nx is turned on and the inner node Nx is discharged to the ground voltage level. Thereby decision is made regarding whether the defective row address is designated or not.

In place of the above-mentioned configuration, such configuration may be utilized that a link element related to a MOS transistor provided corresponding to an address signal other than a defective row address signal is blown off. The program circuit may receive the high voltage Vpp in place of the power source voltage Vcc from the main power source line 1.

The reference voltage generating circuit 10 includes a reference voltage generating section 95 for generating prescribed reference voltages Vref1 and Vref2 (or Vrefa and Vrefb), and a level adjusting section 96 for adjusting the level of the reference voltages generated by the reference voltage generating section 95. In FIG. 14, link elements LL1–LLn included in the level adjusting section 96 are shown representatively. Programming of a defective row address in the program circuit 93 is executed after the test of inspecting whether a defective memory cell exists or not in the semiconductor integrated circuit device is carried out. On the other hand, in the reference voltage generating circuit 10, in order to adjust the levels of the reference voltages Vref1 and Vref2 (or Vrefa and Vrefb), selective blown off of the link elements LL1–LLn included in the level adjusting section 96 is carried out. The link elements LL1–LLn and the link elements L1–Ln included in the program circuit 93 are made of the same material (e.g, fusible material of low resistance such as polysilicon or silicide or aluminum and further preferably constituted into the same shape. Thereby the program of the link elements L1–Ln included in the program circuit 93 and the blown off (program) of the link elements LL1–LLn included in the level adjusting section 96 can be carried out in the same process, and the level adjusting time to adjust the levels of the reference voltages Vref1 and Vref2 (or Vrefa and Vrefb) generated by the reference voltage generating circuit can be substantially neglected and the process can be simplified. The selective blown off of the link elements LL1–LLn of the level adjusting section 96 cannot be carried out while the standby current is monitored. In this case, an amount of the consumed current (subthreshold current) is measured in the standby cycle. The relationship between measured consumed current and a link element to be blown off are previously prepared in the form of table, and the selective blown off of the link elements LL1–LLn of the level adjusting section 96 is executed according to the table. The blown off using a laser for example can be executed continuously for the link elements L1–Ln and LL1–LLn under the same irradiation condition.

As above described, according to the configuration of the fourth embodiment, the time required for the level adjustment of the reference voltage can be substantially neglected and hence the manufacturing time of the semiconductor integrated circuit device is shortened and the manufacturing cost is reduced.

Embodiment 5

Figure 15:
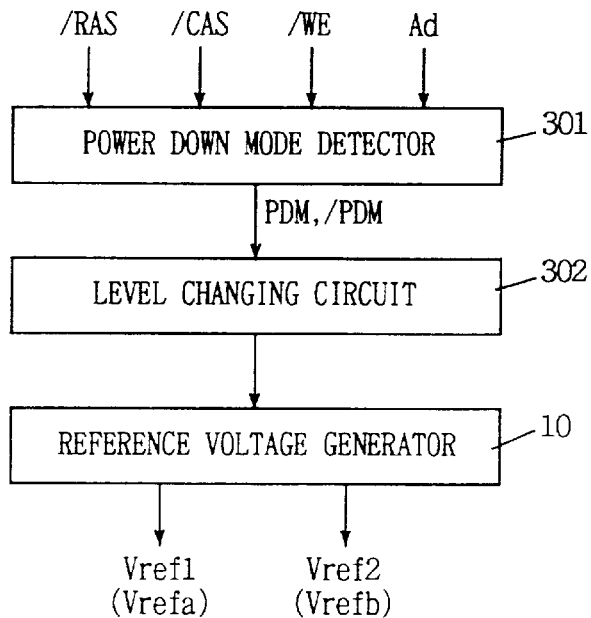
FIG. 15 is a diagram showing schematically a configuration of a main part of a semiconductor integrated circuit device according to a fifth embodiment of the invention.

FIG. 15 is a diagram showing a configuration of a main part of a semiconductor integrated circuit device according to a fifth embodiment of the present invention. In FIG. 15, in order that the voltage level of the reference voltages Vref1 (Vrefa) and Vref2 (Vrefb) generated by the reference voltage generating circuit 10 is changed at the data holding mode, a power down mode detecting circuit 301 for detecting a power down mode in response to signals /RAS, /CAS, /WE and a specific address signal Ad, and a level changing circuit 302 for changing the voltage levels of the reference voltages Vref1 (Vrefa) and Vref2 (Vrefb) generated by the reference voltage generating circuit 10 in response to detection signals PDM and /PDM from the power down mode detecting circuit 301 are provided. The power down mode means a data holding mode, and in this mode, only holding of data is carried out in the semiconductor device (refreshing is carried out at prescribed time intervals by the self refresh mode). In the power down mode, it is preferable that the power consumption is reduced as much as possible. In general, the power down mode is used as an operation mode of a memory device in a personal computer of a battery driven type, and in order to lengthen the battery life, it is preferable that the current consumption is reduced as much as possible. In the power down mode, the voltage levels of the reference voltages Vref1 and Vref2 (or Vrefa and Vrefb) are lowered and raised respectively, and the subthreshold current at the standby cycle is further decreased. In the power down mode, only the refresh operation on memory cell data is carried out at the inside, and any access is not carried out from the outside, and therefore high speed access is not required. The current consumption can be reduced without affecting the operation characteristics thereof.

In the configuration shown in FIG. 15, the power down mode detecting circuit 301 detects the power down mode from so-called WCBR condition by the signals /RAS, /CAS and /WE and the specific address key of the specific address signal Ad. In this case, such configuration may be utilized that a specific signal designating the power down mode is exclusively employed. The term "power down mode" is used here to indicate generally the operation mode or the low current consumption mode in which only data holding operation is internally carried out in the semiconductor memory device.

Specific Configuration 1

Figure 16:
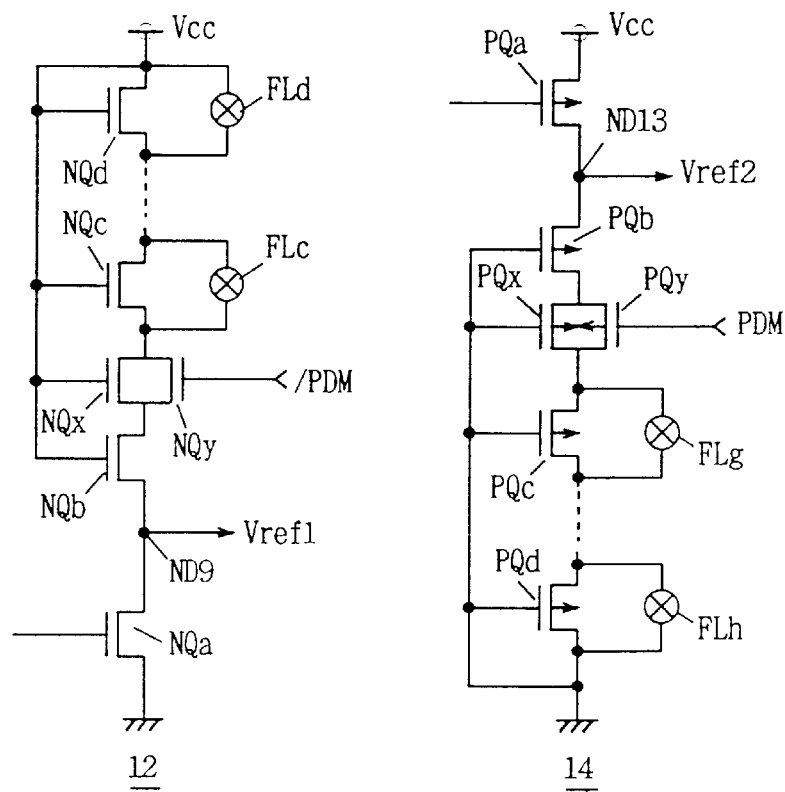
FIG. 16 is a diagram showing an example of a configuration of a level changing circuit shown in FIG. 15.

FIG. 16 is a diagram showing a specific configuration of the level changing circuit 302 shown in FIG. 15. In FIG. 16, configuration of an output part of the reference voltage generating circuits 12 and 14 shown in FIG. 9 is shown. Parts corresponding to those in the configuration shown in FIG. 9 are denoted by the same reference numerals. In addition to the configuration shown in FIG. 9, the reference voltage generating circuit 12 further includes a MOS transistor NQx provided between the MOS transistor NQc and the MOS transistor NQb. The gate electrode of the n-channel MOS transistor NQx is connected to receive the power source voltage Vcc. An n-channel MOS transistor NQy having its gate electrode receiving the power down mode detecting signal /PDM from the power down mode detecting circuit 301 is arranged in parallel to the MOS transistor NQx.

Figure 17:
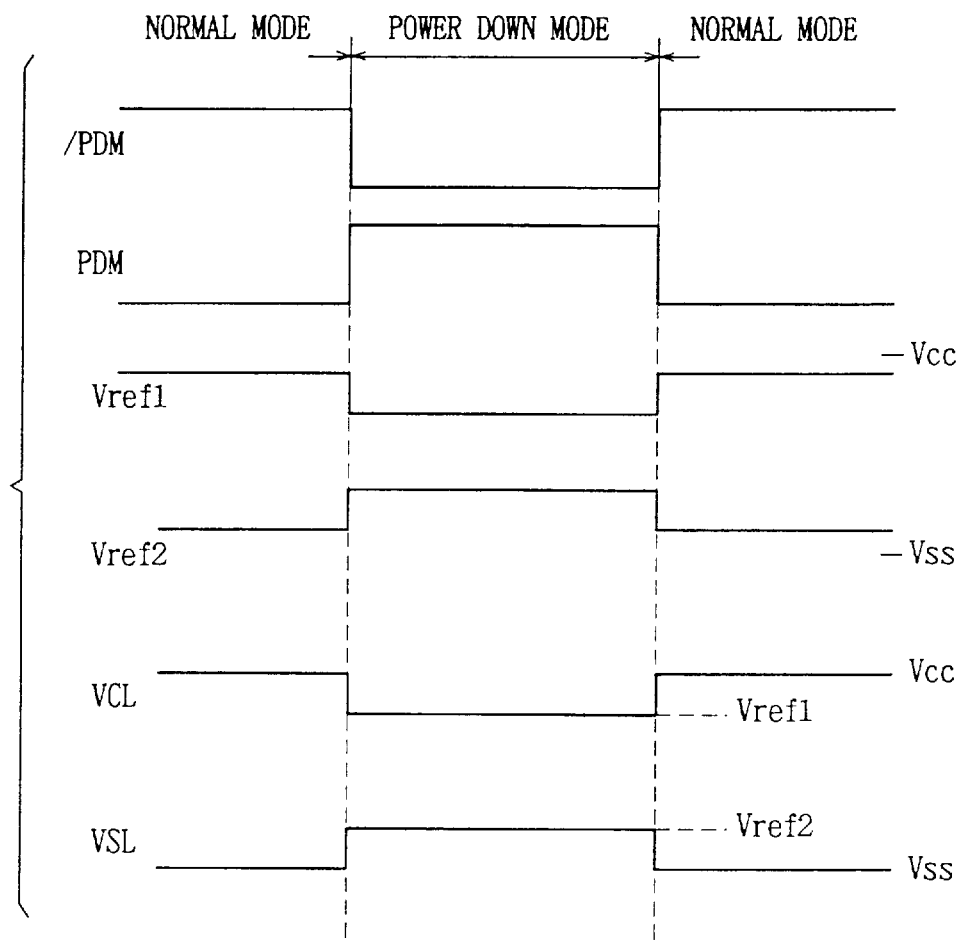
FIG. 17 is a signal waveform chart showing operation of the circuit shown in FIG. 16.

In the reference voltage generating circuit 14, in addition to the configuration shown in FIG. 9, a p-channel MOS transistor PQx is further provided between the p-channel MOS transistors PQb and PQc. The level changing circuit 302 includes a p-channel MOS transistor PQy provided in parallel to the MOS transistor PQx and having its gate electrode receiving the power down mode detection signal PDM. Now, operation of the configuration shown in FIG. 16 will be described referring to an operation waveform chart of FIG. 17.

In the normal mode different from the power down mode, in this operation mode, external access to the semiconductor integrated circuit device becomes possible.), the power down mode detecting signal PDM from the power down mode detecting circuit 301 is at L level. In this state, the MOS transistor NQy is turned on, and the MOS transistor PQy is turned on. The reference voltages Vref1 and Vref2 at prescribed voltage levels are generated and supplied to the differential amplifiers 5 and 6 shown in FIG. 6 respectively.

If the power down mode is designated, the power down mode detecting signal PDM from the power down mode detecting circuit 301 is at H level, and on the other hand, the complementary signal /PDM is at L level. Thereby the MOS transistor NQy is turned off, and the resistance value of the MOS transistor NQx is added to the resistance value provided by the MOS transistor series. Thus the voltage drop between the power source voltage Vcc supply node (main power source line or power source node) and the output node ND9 becomes large, and the voltage level of the reference voltage Vref1 becomes low in comparison with that in the normal mode.

On the other hand, in the reference voltage generating circuit 14, the MOS transistor PQy is turned off, and the resistance value between the output node ND13 and the ground voltage Vss supply node (ground node or main ground line) increases in comparison with that in the normal mode due to the resistance value of the MOS transistor PQx. Thereby the voltage level of the reference voltage Vref2 rises in comparison with that in the normal mode.

The reference voltages Vref1 and Vref2 determine the voltage VCL on the sub power source line and the voltage VSL on the sub ground line at the standby cycle. The voltage VCL is lowered and the voltage VSL rises at the standby cycle in the power down mode in comparison with that in the standby cycle in the normal mode, and the transistor operating in the subthreshold region is brought to the OFF-state more strongly, and the subthreshold current is further reduced. In the active cycle (refresh operation) in the power down mode, the switching transistors Q1 and Q2 shown in FIG. 6 are turned on and the refresh of the memory cell data is executed.

Specific Configuration 2 of Level Changing Circuit

Figure 18:
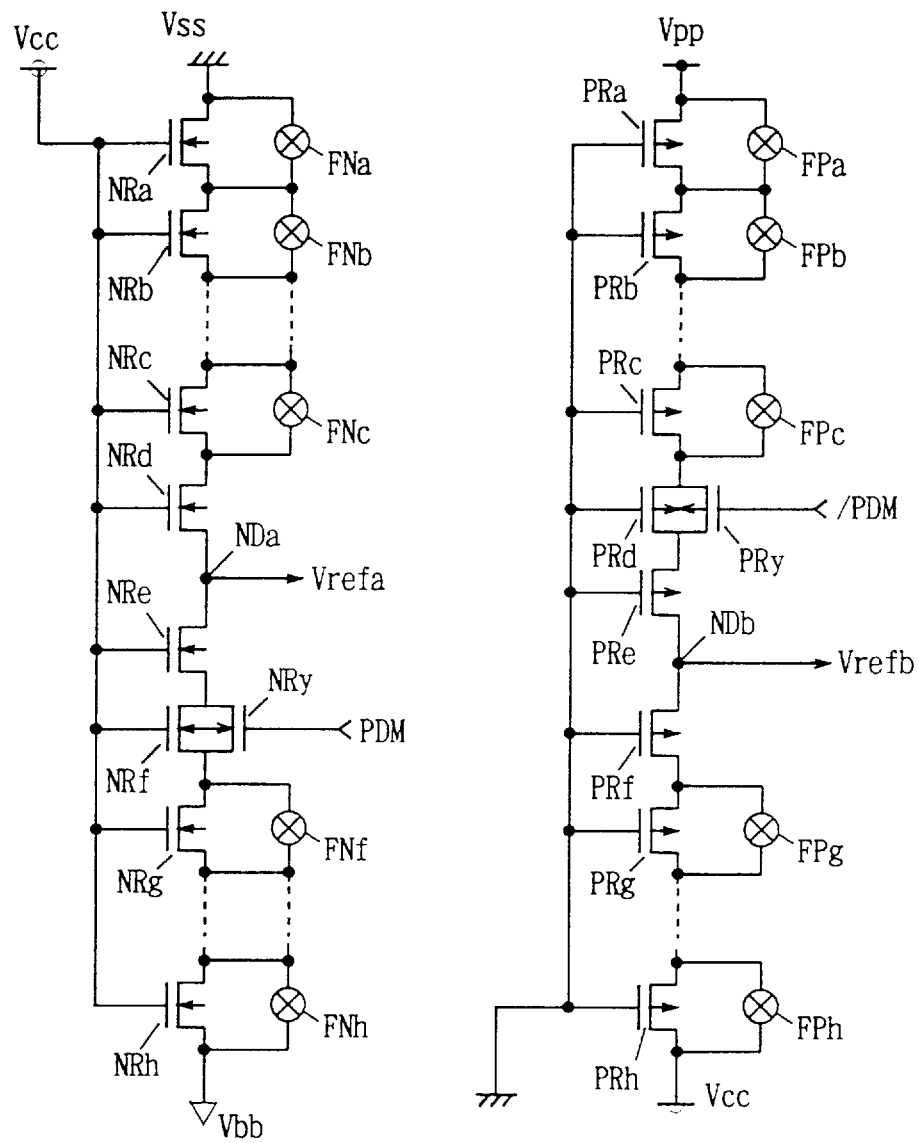
FIG. 18 is a diagram showing another configuration of the level changing circuit shown in FIG. 15.

FIG. 18 is a diagram showing the second specific configuration of the level changing circuit shown in FIG. 15. In FIG. 18, the configuration of the level changing circuit for the reference voltage generating circuits 40 and 50 shown in FIG. 10 is shown. In FIG. 18, the reference voltage generating circuit 40 includes n-channel MOS transistors NRa–NRh connected in series between the ground voltage Vss supply node and the reference voltage Vbb supply node, and fusible link elements FNa–FNc and FNf–FNh provided in parallel to the MOS transistors NRa–NRc and NRg–NRh. The gate electrodes of the MOS transistors NRa–NRh are commonly connected to the power source voltage Vcc supply node, and these MOS transistors NRa–NRh all act as resistor elements. The link elements FNa–FNc and FNf–FNh are selectively blown off, and adjust the voltage level of the reference voltage Vrefa. The reference voltage Vrefa is outputted from the joint node NDa of the MOS transistors NRd and NRe. The voltage changing circuit includes an n-channel MOS transistor NRy connected in parallel to the MOS transistor NRf. The MOS transistor NRy receives the power down mode detecting signal PDM at its gate electrode.

The reference voltage generating circuit 50 includes p-channel MOS transistors PRa–PRh connected in series between the high voltage Vpp supply node and the power source voltage Vcc supply node, and fusible link elements FPa–FPc and FPg–FPh provided in parallel to the MOS transistors PRa–PRc and PRf–PRh respectively. The gate electrodes of the MOS transistors PRa–PRh are connected to the ground voltage Vss supply node, and these MOS transistors PRa–PRh act as resistor elements. The reference voltage Vrefb is outputted from the joint node NDb of the MOS transistors PRe and PRf.

Figure 19:
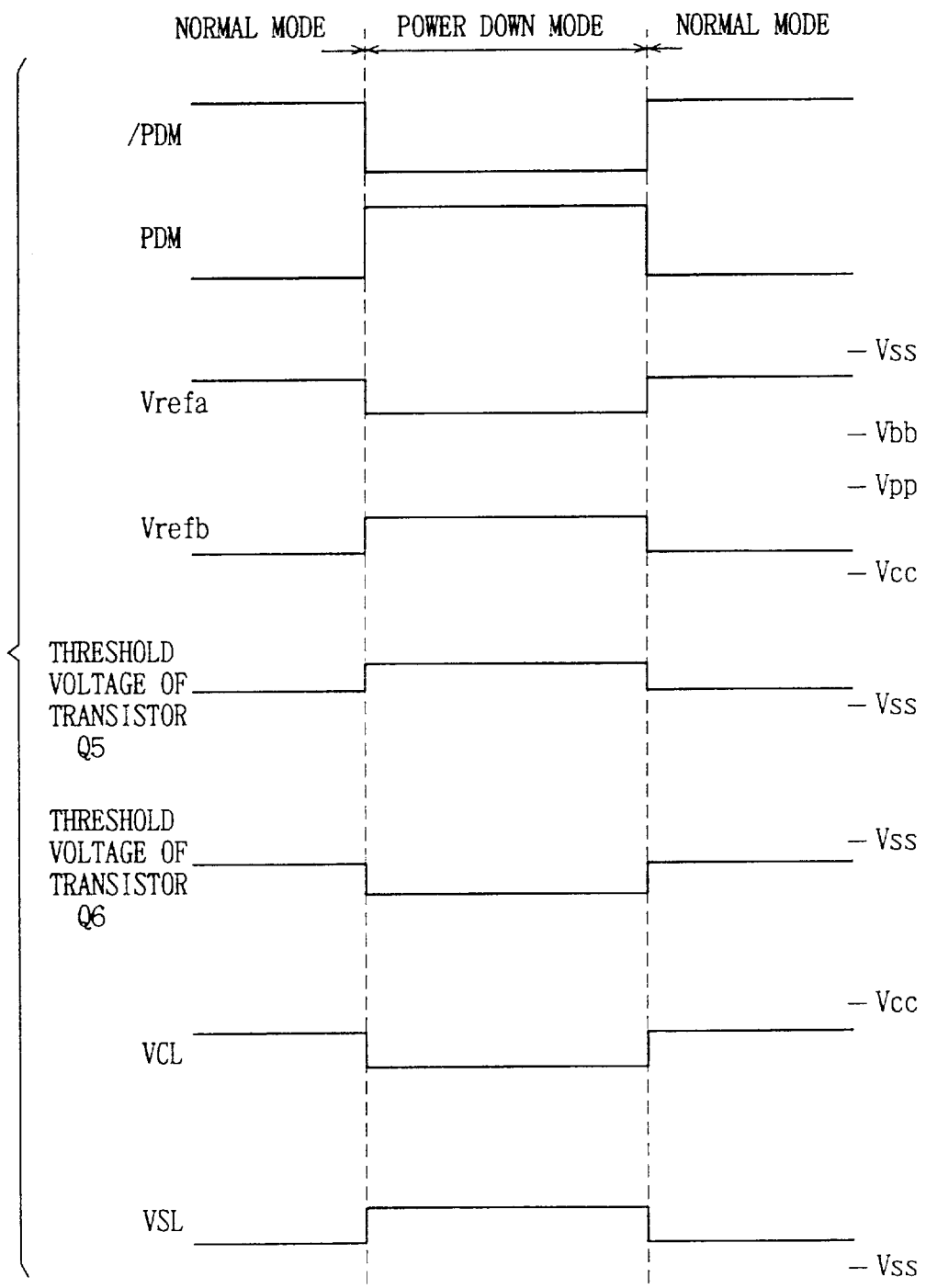
FIG. 19 is a signal waveform chart showing the operation of the circuit shown in FIG. 18.

The level changing circuit is provided in parallel to the MOS transistor PRb, and includes a p-channel MOS transistor PRy receiving the power down mode detecting signal /PDM at its gate electrode. The reference voltages Vrefa and Vrefb are applied to back gates of the MOS transistors Q5 and Q6 respectively shown in FIG. 10. Now, operation of the circuit shown in FIG. 18 will be described referring to FIG. 19 being an operation waveform chart thereof.

In the normal mode, the power down mode detecting signals PDM and /PDM are at L level and H level respectively. In this state, the MOS transistor NRy is at the OFF-state, and also the MOS transistor PRy is at the OFF-state. The reference voltages Vrefa and Vrefb with the voltage levels previously set are applied to back gates of the MOS transistors Q5 and Q6 shown in FIG. 10, and the transistors Q5 and Q6 provide prescribed threshold voltages respectively. At the standby cycle in normal mode, the voltages VCL and VSL are maintained to the voltage levels determined by the threshold voltages of the MOS transistors Q5 and Q6 respectively.

If the power down mode is designated, the power down mode detecting signals PDM and /PDM are at H level and L level respectively, and both MOS transistors NRy and PRy are turned on. In the reference voltage generating circuit 40, the MOS transistor NRf is shortcircuited electrically and the resistance value between the node NDa and the negative voltage Vbb supply node decreases. Thereby the voltage level of the reference voltage Vrefa outputted from the node NDa is lowered and made further close to the negative voltage Vbb. The threshold voltage of the n-channel MOS transistor Q5 rises and hence the voltage level of the voltage VCL becomes lower than that at the standby cycle in the normal mode.

On the other hand, in the reference voltage generating circuit 50, the MOS transistor PRd is shortcircuited electrically, and the resistance value between the high voltage Vpp supply node and the node NDb is lowered and the voltage level of the reference voltage Vrefb rises. Thereby the threshold voltage of the p-channel MOS transistor Q6 becomes more negative (the absolute value becomes large), and the voltage VSL becomes higher than that at the standby cycle in the normal mode. MOS transistor operating in the subthreshold region at the standby cycle in the power down mode can be brought to the OFF-state more strongly, and the current consumption due to the subthreshold current can be reduced. In the power down mode, as above described, since only the refresh is carried out and an external access is not carried out, even if the restoring time of the voltages VCL and VSL to the power source voltage Vcc and the ground voltage Vss becomes slightly long, any problem is not produced.

As above described, according to the configuration of the fifth embodiment, at the data holding mode, since difference between the voltage VCL and the power source voltage Vcc and difference between the voltage VSL and the ground potential Vss are enlarged in comparison with those in the normal mode, the current consumption at the standby cycle can be more decreased.

Embodiment 6

Figure 20:
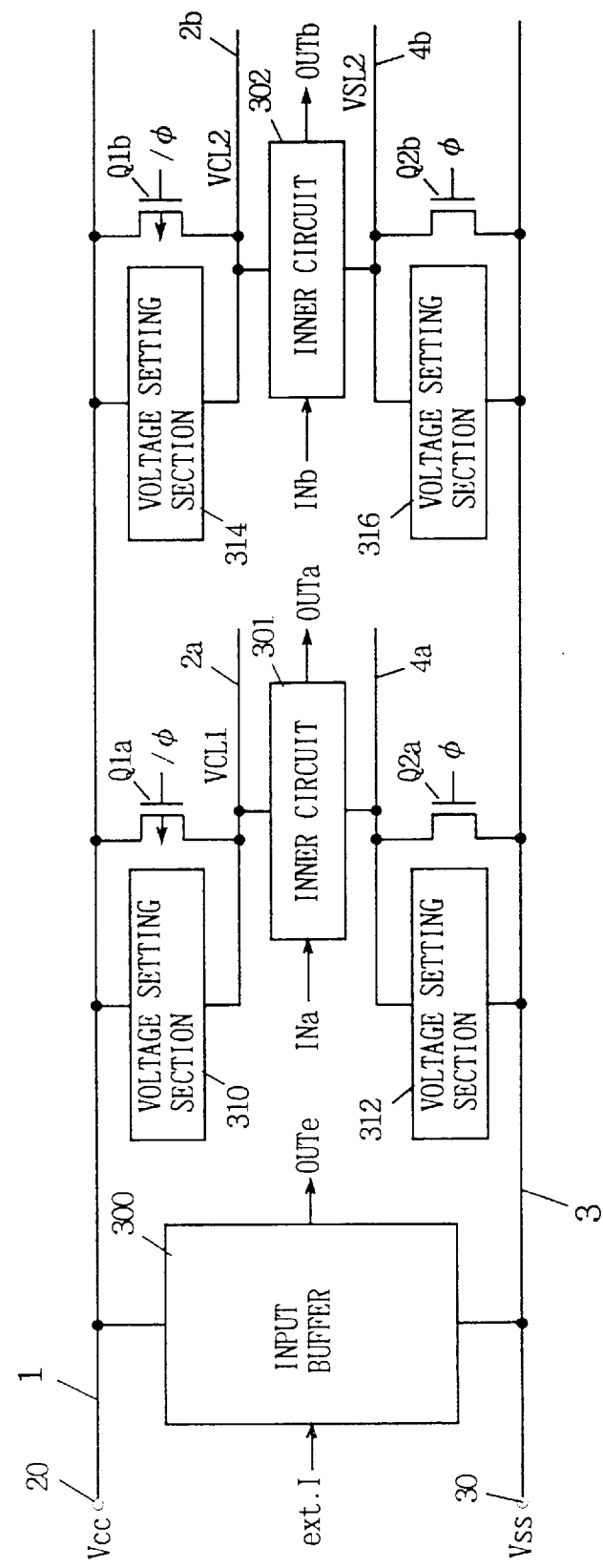
FIG. 20 is a diagram showing a configuration of a main part of a semiconductor integrated circuit device according to a sixth embodiment of the invention.

FIG. 20 is a diagram showing a configuration of a main part of a semiconductor integrated circuit device according to a sixth embodiment of the present invention. In FIG. 20, the semiconductor integrated circuit device includes an input buffer 300 receiving an external signal ext.I and performing buffer processing thereon and generating an internal signal OUTe, an inner circuit 301 receiving an input signal INa and performing prescribed logic processing thereon and generating an output signal OUTa, and an inner circuit 302 performing prescribed logic processing on an input signal INb and generating an internal output signal OUTb. The input buffer 300 operates using the power source voltage Vcc on the main power source line 1 and the ground voltage Vss on the main ground line 3 as both operation power source voltages. The voltage Vcc or Vss is applied to the back gate of a transistor included in the inner circuit 302.

A sub power source line 2a and a sub ground line 4a are arranged for the inner circuit 301. A p-channel MOS transistor Q1*a* conducting in response to operation cycle defining signal /φ and connecting the main power source line 1 and the sub power source line 2a electrically, and a voltage setting section 310 for setting the voltage level of the voltage VCL1 on the sub power source line 2a at the standby cycle are arranged between the sub power source line 2a and the main power source line 1. An n-channel MOS transistor Q2*a* for connecting the sub ground line 4a to the main ground line 3 electrically in response to operation cycle defining signal φ, and a voltage setting section 312 for setting the voltage level of the voltage VSL1 on the sub ground line 4a at the standby cycle are arranged for the sub ground line 4a. The voltage setting sections 310 and 312 include a reference voltage generating circuit, a differential amplifier circuit and a MOS transistor conducting in response to an output of the differential amplifier circuit, or include a reference voltage generating circuit and a MOS transistor receiving the reference voltage of the reference voltage generating circuit at its back gate.

A sub power source line 2b and a sub ground line 4b are provided for the inner circuit 302. A p-channel MOS transistor Q1*b* for connecting the main power source line 1 and the sub power source line 2b electrically in response to the operation cycle defining signal /φ, and a voltage setting section 314 for setting the voltage level of the voltage VCL2 on the sub power source line 2b at the standby cycle are provided for the sub power source line 2b. An n-channel MOS transistor Q2*b* for connecting the sub ground line 4b to the main ground line 3 electrically in response to the operation cycle defining signal φ, and a voltage setting section 316 for setting the voltage level of the voltage VSL on the sub ground line 4b at the standby cycle are provided for the sub ground line 4b. The voltage setting sections 314 and 316 have configuration similar to those of voltage setting sections 310 and 312 respectively.

In the configuration shown in FIG. 20, the inner circuit 301 is shown operating using the voltage VCL1 on the sub power source line 2b and the voltage VSL1 on the sub ground line 4b as both operation power source voltages. In the practical state, however, also the voltage on the main power source line 1 or the main ground line 3 is utilized in accordance with the voltage level at the standby cycle of the input signal INa and the output signal OUTa. In FIG. 20, since the voltage level of the voltages VCL1 and VSL1 is a matter of concern, for convenience, the inner circuit 301 is shown operating using voltages on the sub power source line 2a and the sub ground line 4a as operation power source voltages. In addition, when the inner circuit 301 is rendered at the output high impedance state in the standby cycle, such configuration may be utilized that the voltage VCL1 on the sub power source line 2a and the voltage VSL1 on the sub ground line 4a are used as both operation power source voltages. This circuit configuration applies also to the inner circuit 302.

As shown in FIG. 20, the inner circuits 301 and 302 have separate power source lines respectively, and the voltage variation (noise) of the sub power source lines 2a and 2b as well as the sub ground lines 4a and 4b is suppressed. Now, operation of the configuration shown in FIG. 20 will be described referring to FIG. 21 being an operation waveform chart thereof.

At the standby cycle, the operation cycle defining signal φ is at high level and the MOS transistor Q1*a*, Q2*a*, Q1*b* and Q2*b* are all in the OFF-state. In this state, the voltages VCL1, VSL1, VCL2 and VSL2 are set to prescribed voltage levels by the voltage setting sections 310, 312, 314 and 316. Now, the voltage setting sections 310 and 314 set the voltages VCL1 and VCL2 to the same voltage level, and the voltage setting sections 312 and 316 set the voltages VSL1 and VSL2 to the same voltage level.

Figure 21:
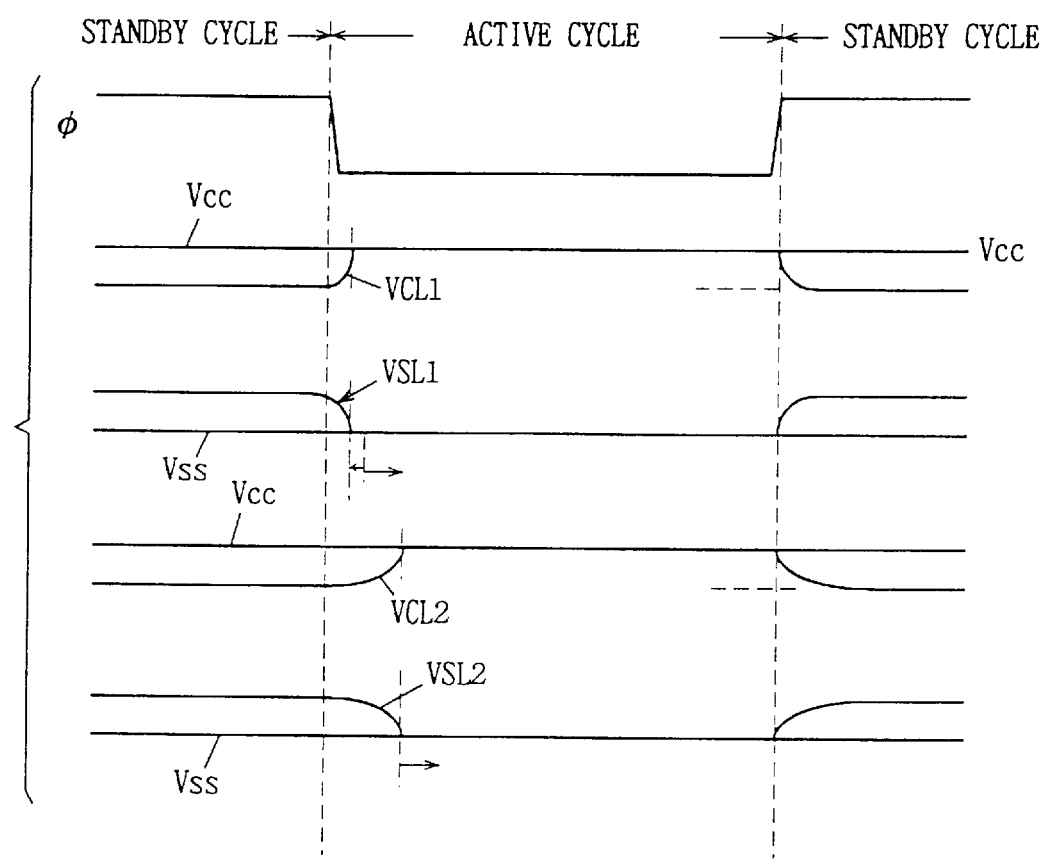
FIG. 21 is a signal waveform chart showing the operation of the semiconductor integrated circuit device according shown in FIG. 20.

If the active cycle begins, the operation cycle defining signal φ is at H level and the MOS transistors Q1*a*, Q1*b*, Q2*a* and Q2*b* are turned on, and the voltages VCL1 and VCL2 are restored to the power source voltage Vcc level, and the voltages VSL1 and VSL2 are restored to the ground potential Vcc level. Since load capacitances or parasitic capacitances attendant on the power source lines 2a and 2b are different from each other, even if the power source lines 2a and 2b are maintained to the same voltage level at the standby state, the difference is produced in the time required for the power source lines 2a and 2b to restore to the level of the power source voltage Vcc. In FIG. 21, the restoring time point of the voltage VCL2 is shown being earlier. This applies to the voltages VSL1 and VSL2. The input buffer 300 operates using the voltages Vcc and Vss on the main power source line 1 and the main ground line 3 as both operation power source voltages. Consequently, immediately after the active cycle begins, the signal ext.I from the outside is accepted and prescribed processing is performed thereon and an internal signal OUTe can be generated. In the semiconductor memory device, since the sequence of generation of input signals and output signals of internal control signal generating circuits is previously determined, the internal control signal generating circuits are made active in a prescribed time sequence. In the inner circuit 301, after the voltages VCL1 and VSL1 on the sub power source line 2a and the sub ground line 4a are set to the prescribed levels of the voltages Vcc and Vss respectively, the input signal INa is made at the active state and an operation thereon is executed. Also in the inner circuit 302, after the voltages VCL2 and VSL2 are restored to the power source voltage Vcc and the ground voltage Vss respectively, the input signal INb is made at the active state and the operation thereon is executed. Prescribed time is required for the signal propagation from the input buffer 300 to the inner circuits 301 and 302. The input buffer 300 is operated using the voltages Vcc and Vss on the main power source line 1 and the main ground line 3 as both power source voltages. The external signal ext.I is incorporated and the inner operation can be started immediately after starting of the active cycle and thus the access time can be significantly reduced.

That is, regarding a circuit part (circuit where input signal is made at the decided state) operating before the voltages VCL and VSL are restored to the voltage levels of the power source voltage Vcc and the ground voltage Vss, the circuit part is operated using the voltages Vcc and Vss on the main power source line 1 and the main ground line 3 as operation power source, and the operation thereof is executed at a timing as early as possible and increase of the access delay is prevented. Regarding a problem that which circuit has the hierarchical power source line configuration with the main and sub power source structure, and that which circuit utilizes only the main power source line 1 and the main ground line 3 as power source lines, the restoring time of the voltage of each sub power source line and sub ground line at the active cycle is measured, and the problem is solved from the relationship between the decided timing of a signal supplied thereto and the measured restoring time. The /RAS buffer 200, the /CAS buffer 210, the /WE buffer and the row address buffer 101 shown in FIG. 3 must incorporate an externally applied a signal and generate an internal signal at timings as early as possible, and therefore they have non-hierarchical power source structure of only the main power source line 1 and the main ground line 3 in similar manner to the input buffer 300 shown in FIG. 20. A part with the hierarchical power source line configuration may be a circuit operating at a relatively late timing. For example, the row decoder 230 shown in FIG. 4 has the hierarchical power source configuration with the main power source line and the sub power source line as well as the main ground line and the sub ground line. Regarding the column system circuit, since the active state is made after lapse of a prescribed time (after lapse of the column interlock period) from the starting of the active cycle, hierarchical power source structure of the main/sub power source lines and the main/sub ground lines may be adopted.

As above described, according to the configuration of the sixth embodiment, the main power source line and the main ground line only are installed for circuits which must be operated at early timing in comparison with timing of the voltages VCL and VSL being restored to the power source voltage Vcc and the ground voltage Vss, thereby the operation of these circuits can be started at early timing and increase of the access delay can be prevented.

Embodiment 7

Figure 22:
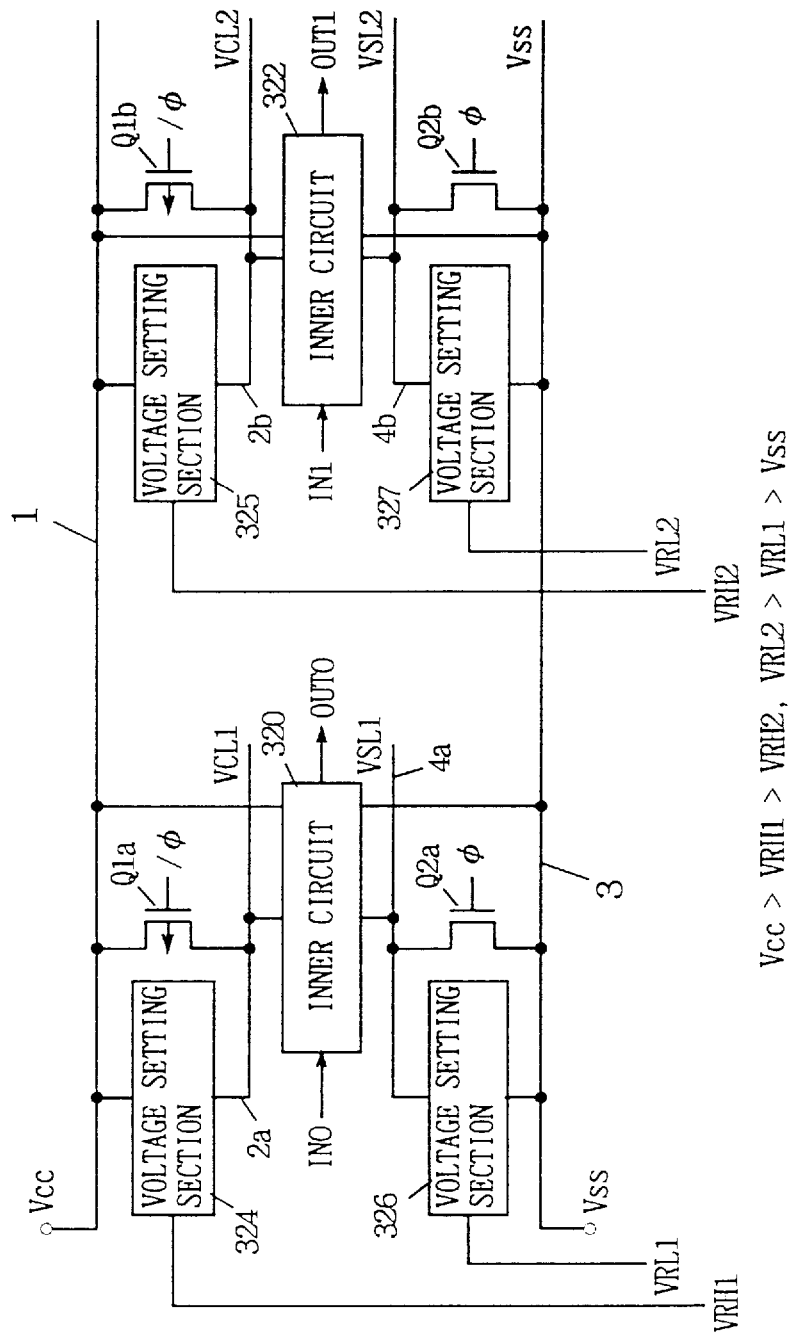
FIG. 22 is a diagram showing a configuration of a main part of a semiconductor integrated circuit device according to a seventh embodiment of the invention.

FIG. 22 is a diagram showing a configuration of a main part of a semiconductor integrated circuit device according to a seventh embodiment of the present invention. In FIG. 22, inner circuits 320 and 322 are shown representatively. The inner circuit 320 performs a prescribed processing on an input signal IN0 and generates an internal output signal OUT0. The inner circuit 322 performs a prescribed logic processing on an input signal IN1 and generates an internal output signal OUT1. A sub power source line 2a and a sub ground line 4a are provided for the inner circuit 320, and a sub power source line 2b and a sub ground line 4b are provided for the inner circuit 322. A p-channel MOS transistor Q1a for electrically connecting the main power source line 1 and the sub power source line 2a in response to operation cycle defining signal /φ and a voltage setting section 324 for setting the voltage VCL1 of the sub power source line 2a at the standby cycle to a prescribed voltage level according to a reference voltage VRH1 are provided for the sub power source line 2a. The voltage setting section 324 includes a differential amplifier and a MOS transistor conducting in response to the output signal of the differential amplifier, or includes a MOS transistor receiving the reference voltage VRH1 at its back gate.

An n-channel MOS transistor Q2a for electrically connecting the sub ground line 4a and the main ground line 3 in response to the operation cycle defining signal φ, and a voltage setting section 326 for setting the level of the voltage VSL1 on the sub ground line 4a at the standby cycle according to a reference voltage VRL1 are provided for the sub ground line 4a. Also the voltage setting section 326 is constituted by a differential amplifier and a MOS transistor receiving an output of the differential amplifier at its gate electrode, or by a MOS transistor receiving the reference voltage VRL1 at its back gate. The inner circuit 320 is shown operating receiving all voltages on the main power source line 1, the sub power source line 2a, the main ground line 3 and the sub ground line 4a. However, suitable power source line/ground line may be selected and utilized according to inner configuration of the inner circuit 320. The voltage Vcc or Vss is applied to the back gate of MOS transistor of the inner circuits 320 and 322.

A sub power source line 2b and a sub ground line 4b are provided for the inner circuit 322. A p-channel MOS transistor Q1b for electrically connecting the main power source line 1 and the sub power source line 2b in response to the operation cycle defining signal /φ, and a voltage setting section 325 for setting the voltage level of the voltage VCL2 on the sub power source line 2b at the standby cycle according to a reference voltage VRH2 are provided for the sub power source line 2b. Also the voltage setting section 325 is constituted by a differential amplifier and a MOS transistor receiving output of the differential amplifier at its gate electrode, or by a MOS transistor receiving the reference voltage at its back gate. An n-channel MOS transistor Q2b for electrically connecting the sub ground line 4b and the main ground line 3 in response to the operation cycle defining signal φ, and a voltage setting section 327 for setting the voltage level of the voltage VSL2 on the sub ground line 4b at the standby cycle according to a reference voltage VRL2 are provided for the sub ground line 4b. Also the voltage setting section 327 is constituted by a differential amplifier and a MOS transistor, or by a MOS transistor. The reference voltage satisfies the following relation.

Vcc>VRH1>VRH2

VRL2>VRL1>Vss

Accordingly, the following relation is satisfied at the standby cycle.

Vcc>VCL1>VCL2

VSL2>VSL1>Vss

Figure 23:
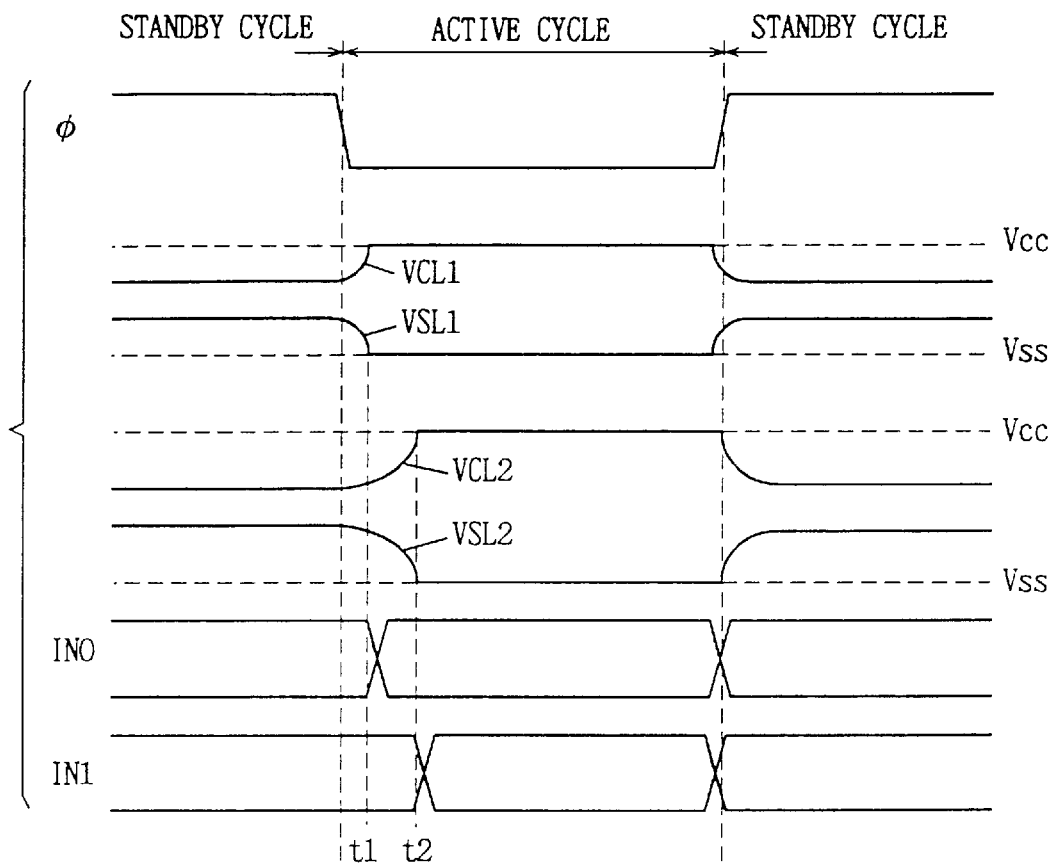
FIG. 23 is a signal waveform chart showing an operation of the semiconductor integrated circuit device shown in FIG. 22.
Figure 24:
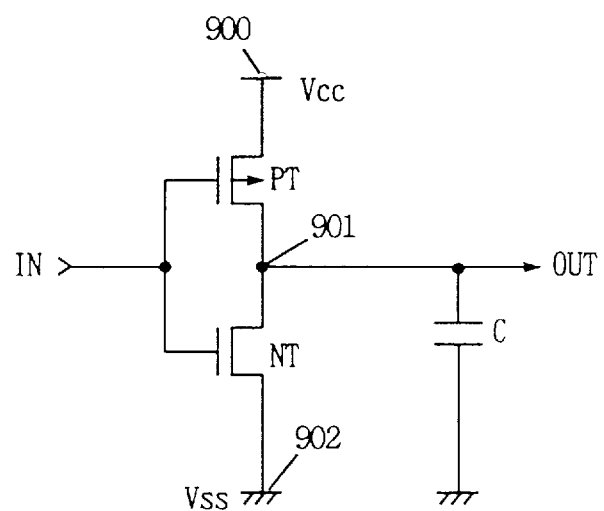
FIG. 24 is a diagram showing a configuration of a CMOS inverter in the prior art.

That is, in the standby cycle, in comparison with MOS transistor operating at the sub threshold region in the inner circuit 320, the MOS transistor operating at the subthreshold region in the inner circuit 322 is kept at stronger OFF-state. Now, operation of the configuration shown in FIG. 22 will be described referring to FIG. 23 being an operation waveform chart thereof.

At the standby cycle, the operation cycle defining signal φ is at H level, and the MOS transistors Q1a, Q1b, Q2a and Q2b are at the OFF-state respectively. In this state, the voltages VCL1, VCL2, VSL1 and VSL2 are set to prescribed voltage levels according to the reference voltages VRH1, VRH2, VRL1 and VRL2 respectively.

When the active cycle begins, the operation cycle defining signal φ becomes L level and the MOS transistors Q1a, Q1b, Q2a and Q2b are turned off respectively. Thereby the voltages VCL1 and VCL2 on the sub power source lines 2a and 2b are restored to the power source voltage Vcc level, and the voltages VSL1 and VSL2 on the sub ground lines 4a and 4b are restored to the ground voltage Vss level. Since the voltage VCL1 is higher than the voltage VCL2, the voltage VCL1 on the sub power source line 2a is restored to the power source voltage Vcc level at time t1 earlier than time t2 of restoration of the voltage VCL2 on the sub power source line 2b, also the voltage VSL1 is restored to the ground voltage Vss at time t1 earlier than time t2 of restoration of the voltage VSL2. Input signal IN0 supplied to the inner circuit 320 is made active at an early timing after the time t1, and the output signal OUT0 from the inner circuit 320 can be made at the decided state at early timing. Regarding the inner circuit 322, since the voltages VCL2 and VSL2 are restored to the voltages Vcc and Vss respectively at time t2, the input signal IN1 is rendered at the decided state at a timing later than the time t2.

As above described, for an inner circuit to be operated at an early timing, the voltage on the sub power source line is set to a voltage level close to the power source voltage Vcc, and the voltage VSL on the sub ground line is set to a voltage level close to the ground voltage Vss. Thereby, while a current consumption caused by the subthreshold current at the standby cycle is reduced, delay of the operation start timing can be reduced, and a semiconductor integrated circuit device operating at high speed or a semiconductor memory device with little access delay is realized. For an inner circuit which may be operated at a relatively late timing, the voltage VCL on the sub power source line is set to a relatively low voltage level, and on the other hand, the voltage VSL on the sub ground line is set to a relatively high level, and thus the subthreshold current is sufficiently suppressed and the current consumption is reduced. Thereby a semiconductor integrated circuit device operating at low current consumption is realized without affecting the operation speed and the access time.

Regarding the reference voltages VRH1, VRL1, VRH2 and VRL2, the configurations in the preceding embodiments shown in FIG. 9 and FIG. 11 respectively can be utilized. In this case, a configuration can be employed in which two sorts of reference voltages are generated through separate output nodes of one reference voltage generator, or configuration of individually generating the reference voltages may be utilized.

As the inner circuit 320, in similar manner to the configuration shown in FIG. 20, input buffers receiving external signals, that is, /RAS buffer, /CAS buffer, /WE buffer and row address buffer are employed, and the inner circuit 322 includes a circuit such as a row decoder.

OTHER MODIFICATIONS

As the MOS transistors Q5 and Q6 shown in FIG. 10, a p-channel MOS transistor and an n-channel MOS transistor may be used respectively. In this arrangement, the polarity of the reference voltage needs be changed and its connection of gate and drain thereof is changed, correspondingly. Also when the reference voltage is changed in accordance with the operation modes, the changing direction thereof is reversed. Thereby similar effects to those of the configuration shown in FIG. 10 can be obtained.

Also in the reference voltage generating circuit shown in FIG. 11, although the p-channel MOS transistors and the n-channel MOS transistors are used, only MOS transistors of one conduction type may be used.

As described above, according to the present invention, a semiconductor integrated circuit device with a low current consumption and sufficiently suppressed access delay can be realized.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor integrated circuit device comprising:
   a main power source line for transmitting a first power source voltage;
   a sub power source line;
   a switching transistor for electrically connecting said main power source line and said sub power source line in response to an operation cycle defining signal;
   an insulated gate type field effect transistor having a back gate, one conduction node connected to said main power source line, other conduction node connected to said sub power source line and a control electrode node connected to either said main power source line or said sub power source line so as to form a diode from a high potential side to a low potential side;
   a reference voltage generating circuit for applying a first reference voltage to said back gate of said insulated gate type field effect transistor, said first reference voltage being different in voltage level from the first power source voltage; and
   a logic gate operating using the voltage on said sub power source line as one operation power source voltage for performing a prescribed logic processing on an applied input signal for outputting.

2. A semiconductor integrated circuit device as set forth in claim 1, further comprising voltage level adjusting means for adjusting the voltage level of said reference voltage.

3. The semiconductor integrated circuit device as set forth in claim 1, further comprising:
   a second sub power source line;
   a second switching transistor for electrically connecting said main power source line and said second sub power source line in response to said operation cycle defining signal;
   a second insulated gate type field effect transistor having a back gate receiving a second reference voltage different in voltage level from said reference voltage generating means from the first reference voltage, one conduction electrode node connected to said main power source line, other conduction node connected to said second sub power source line, and a control electrode connected to one of said second sub power source line and said main power source line; and
   a second logic gate operating using the voltage on said second sub power source line as one operation power source voltage for performing a prescribed logic processing on a received input signal for outputting.

4. A semiconductor integrated circuit device as set forth in claim 1, further comprising means for changing a voltage level of said first reference voltage in response to a specific operation mode designating signal.

5. A semiconductor integrated circuit device as set forth in claim 1, further comprising:
   a memory cell array including a plurality of memory cells arranged in a matrix of rows and columns;
   a circuit including fusible link elements for programming a defective address specifying a row or column having a defective memory cell existing thereon in said memory cell array; and
   a level adjusting circuit including program elements made of a same common material as that of said link elements, for adjusting a voltage level of said reference voltage.

6. A semiconductor integrated circuit device as set forth in claim 1, further comprising:
   a memory cell array including a plurality of memory cells arranged in a matrix of rows and columns;
   another main power source line for transmitting a second power source voltage being different from said first power source voltage in logic level;
   input buffer circuitry operating using the voltages on both main power supply lines as both operation power supply voltages for performing a buffer processing on externally applied signals including an operation cycle defining signal, a data input/output mode designating signal and an address signal and generating internal signals; and a row related circuit operating using the voltage on said sub power supply line as one operation power source voltage and responsive to a signal generated according to a row address strobe signal initiating a row selection operation for said memory cell array for performing a predetermined operation, said row address strobe signal being generated from said input buffer circuitry.

7. The semiconductor integrated circuit device as set forth in claim 1, wherein said first reference voltage is generated by a circuit including a resistance element having a resistance value fuse-programmable, and a circuit coupled to said resistance element for causing a current flow through said resistance element.

8. The semiconductor integrated circuit device as set forth in claim 4, wherein said first power source voltage is a voltage of a first logic level, and said means for changing changes the first reference voltage in a direction to a voltage at a second logic level.

9. The semiconductor integrated circuit device as set forth in claim 4, wherein said first reference voltage is generated by resistor elements, and said means for changing includes means-responsive to said specific operation mode designating signal for electrically short-circuiting at least one resistor element of said resistor elements.

10. The semiconductor integrated circuit device as recited in claim 4, wherein said semiconductor integrated circuit device comprises a memory device, and said specific operation mode designating signal designates a data holding mode for holding data in said memory device.

11. The semiconductor integrated circuit device as recited in claim 1, further comprising:
a second main power source line for transmitting a second power source voltage different in logic level from said first power source voltage;
a second sub power source line;
a second switching transistor for electrically connecting said second main power source line and said second sub power source line in response to said operation cycle defining signal;
a second insulated gate type field effect transistor having a back gate, one conduction node connected to said second main power source line and, other conduction node connected to said second sub power source line, and a control electrode node so connected to either said main power source line or said sub power source line as to form a diode from a high potential side to a low potential side; and
a second reference voltage generating circuit for applying a second reference voltage to said back gate of said second insulated gate type field effect transistor; and wherein said logic operating using the voltage on said second main power source line as other operation power source voltage.

12. The semiconductor integrated circuit device as recited in claim 11, further comprising a second logic gate operating using the voltages on said first main power source line and said second sub power source line, for performing a predetermined logical operation on an applied signal.

13. The semiconductor integrated circuit device as recited in claim 1, wherein said reference voltage generating means includes means for resistance-dividing a predetermined voltage larger in absolute value than the first power source voltage to generate said first reference voltage.

14. A semiconductor integrated circuit device comprising:
a main power source line for transmitting a power source voltage of a prescribed level;
a sub power source line;
a switching element for electrically connecting said main power source line and said sub power source line in response to an operation cycle defining signal;
voltage setting means for maintaining said sub power source line at a voltage level different from said power source voltage upon non-conductive state of said switching element, said voltage setting means comprising a diode element connected between the main power source line and the sub power source line for causing a voltage drop between the main power source line and the sub power source line upon said non-conductive state of said switching element; and
a logic gate including an insulated gate type field effect transistor having a back gate receiving the power source voltage on said main power source line, and one conduction node connected to receive the voltage on said sub power source line, for performing a prescribed processing on an applied signal and outputting the processed signal.

15. The semiconductor integrated circuit device according to claim 14, wherein said voltage setting means includes means for setting said voltage drop through setting a forward voltage drop of said diode element.

16. The semiconductor integrated circuit device according to claim 14, wherein said voltage setting means includes a diode-connected insulated gate type field effect transistor connected between said main power source line and said sub power source line, and a reference voltage generator for generating a reference voltage different in voltage level from said power source voltage for application to a backgate of the diode-connected insulate gate type field effect transistor.

* * * * *